(12) United States Patent
Ryu et al.

(10) Patent No.: US 11,812,641 B2
(45) Date of Patent: Nov. 7, 2023

(54) DISPLAY DEVICE

(71) Applicant: Samsung Display Co., Ltd., Yongin-Si (KR)

(72) Inventors: Ji-hun Ryu, Hwaseong-si (KR); IlNam Kim, Hwaseong-si (KR); Jae-Kyoung Kim, Hwaseong-si (KR); WonSang Park, Yongin-si (KR); Eunjin Sung, Yongin-si (KR); Seongryong Lee, Hwaseong-si (KR); Jonghyun Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/102,881

(22) Filed: Jan. 30, 2023

(65) Prior Publication Data

US 2023/0180534 A1     Jun. 8, 2023

Related U.S. Application Data

(63) Continuation of application No. 17/133,814, filed on Dec. 24, 2020, now Pat. No. 11,569,316.

(30) Foreign Application Priority Data

Jan. 22, 2020    (KR) ................. 10-2020-0008653

(51) Int. Cl.
    *H10K 59/122*      (2023.01)
    *H10K 50/844*      (2023.01)
    (Continued)

(52) U.S. Cl.
    CPC .......... *H10K 59/122* (2023.02); *H10K 50/844* (2023.02); *H10K 59/352* (2023.02);
    (Continued)

(58) Field of Classification Search
    CPC .... H10K 59/122; H10K 59/352; H10K 59/38; H10K 59/40; H10K 59/353; H10K 50/844
    See application file for complete search history.

(56) References Cited

U.S. PATENT DOCUMENTS

| 2017/0351898 A1 | 12/2017 | Zhang |
| 2018/0089485 A1 | 3/2018 | Bok |

(Continued)

FOREIGN PATENT DOCUMENTS

| KR | 10-1290004 | 7/2013 |
| KR | 10-2018-0033361 | 4/2018 |
| KR | 10-1918751 | 2/2019 |

*Primary Examiner* — Anne M Hines
*Assistant Examiner* — Jose M Diaz
(74) *Attorney, Agent, or Firm* — F. Chau & Associates, LLC

(57) ABSTRACT

A display device includes a substrate comprising a plurality of pixel areas and a non-pixel area surrounding each of the plurality of pixel areas. The non-pixel area includes a plurality of first areas and a second area surrounding the plurality of first areas. A functional layer is disposed on the substrate and includes a plurality of first holes defined through the functional layer and overlapping the plurality of first areas. An element layer is disposed on the functional layer. A pixel definition layer is disposed on the element layer and overlaps the non-pixel area. The pixel definition layer includes pixel openings defined therethrough. The pixel openings overlap the plurality of pixel areas. A plurality of light emitting elements is disposed on the element layer and is disposed in the pixel openings.

20 Claims, 17 Drawing Sheets

(51) Int. Cl.
*H10K 59/38* (2023.01)
*H10K 59/40* (2023.01)
*H10K 59/35* (2023.01)

(52) U.S. Cl.
CPC ........... *H10K 59/353* (2023.02); *H10K 59/38* (2023.02); *H10K 59/40* (2023.02)

(56) References Cited

U.S. PATENT DOCUMENTS

2019/0326367 A1 10/2019 Jung et al.
2021/0225970 A1 7/2021 Ryu et al.

DISPLAY DEVICE

CROSS-REFERENCE TO RELATED APPLICATIONS

This U.S. application is a continuation of U.S. patent application Ser. No. 17/133,814 filed on Dec. 24, 2020, which claims priority under 35 U.S.C. § 119 to Korean Patent Application No. 10-2020-0008653, filed on Jan. 22, 2020 in the Korean Intellectual Property Office, the disclosures of which are incorporated by reference in their entireties herein.

TECHNICAL FIELD

The present inventive concepts relate to a display device.

DISCUSSION OF RELATED ART

Numerous electronic devices include a display device for displaying an image to a user, such as a smartphone, a digital camera, a notebook computer, a navigation unit, and a smart television. The display device generates the image and provides the image to the user through a display screen.

The display device may provide a variety of functions, such as displaying the image to provide information to the user or sensing the user's input for communication with the user. In recent developments, the display device includes a function of sensing a fingerprint of the user. For example, the display device may include an optical fingerprint sensor for sensing an incident light. The fingerprint sensor may be disposed on a rear surface of the display panel and assembled with the display panel.

SUMMARY

Exemplary embodiments of the present inventive concepts provide a display device including an optical transmission path through which an external light reaches a sensor layer disposed at a lower portion thereof when the display device is provided with a color filter layer and a pixel definition layer having a black color.

In an exemplary embodiment of the present inventive concepts, a display device includes a substrate comprising a plurality of pixel areas and a non-pixel area surrounding each of the plurality of pixel areas. The non-pixel area includes a plurality of first areas and a second area surrounding the plurality of first areas. A functional layer is disposed on the substrate and includes a plurality of first holes defined through the functional layer and overlapping the plurality of first areas. An element layer is disposed on the functional layer. A pixel definition layer is disposed on the element layer and overlaps the non-pixel area. The pixel definition layer includes pixel openings defined therethrough, the pixel openings overlapping the plurality of pixel areas. A plurality of light emitting elements is disposed on the element layer and is disposed in the pixel openings.

In an exemplary embodiment of the present inventive concepts, a display device includes a substrate comprising a plurality of pixel areas and a non-pixel area surrounding each of the plurality of pixel areas. The non-pixel area includes a plurality of first areas and a second area surrounding the plurality of first areas. A functional layer is disposed on the substrate and includes a plurality of first holes defined through the functional layer and overlapping the plurality of first areas. An element layer is disposed on the functional layer. A pixel definition layer is disposed on the element layer and overlaps the non-pixel area. The pixel definition layer includes pixel openings defined through the pixel definition layer and overlapping the plurality of pixel areas. Second holes are defined through the pixel definition layer and overlap the first holes. An area of each of the second holes is greater than an area of each of the first holes. The areas of the first holes and second holes are defined in a first direction and a second direction that are parallel to an upper surface of the substrate and cross each other. A plurality of light emitting elements is disposed on the element layer and is disposed in the pixel openings.

In an exemplary embodiment of the present inventive concepts, a display device includes a substrate comprising a plurality of pixel areas and a non-pixel area surrounding each of the plurality of pixel areas. The non-pixel area includes a plurality of first areas and a second area surrounding the plurality of first areas. A functional layer is disposed on the substrate and includes first holes defined through the functional layer and overlapping the plurality of first areas. A sensor layer is disposed under the functional layer. The sensor layer includes at least one optical fingerprint sensor. A plurality of light emitting elements is disposed on the substrate and is configured to emit light in regions overlapping the plurality of pixel areas. A pixel definition layer is disposed on the substrate and overlaps the non-pixel area. The pixel definition layer includes second holes defined through the pixel definition layer and overlapping the first holes. A color filter layer is disposed on the plurality of light emitting elements and the pixel definition layer and includes sub-color filters overlapping the plurality of first areas. An input sensing unit is disposed between the light emitting elements and the color filter layer. The input sensing unit includes a first light transmission area overlapping the plurality of first areas. The first holes, second holes, sub-color filters and first light transmission area form an optical transmission path for external light to reach the sensor layer.

According to the above, the external light may easily reach the sensor layer disposed under the substrate through the optical transmission path defined by the first holes and the second holes overlapping the first areas defined in the non-pixel area. Thus, the sensor layer may be stably operated.

BRIEF DESCRIPTION OF THE DRAWINGS

The above and other advantages of the present inventive concepts will become readily apparent by reference to the following detailed description when considered in conjunction with the accompanying drawings wherein.

DETAILED DESCRIPTION OF EXEMPLARY EMBODIMENTS

Figure 1:
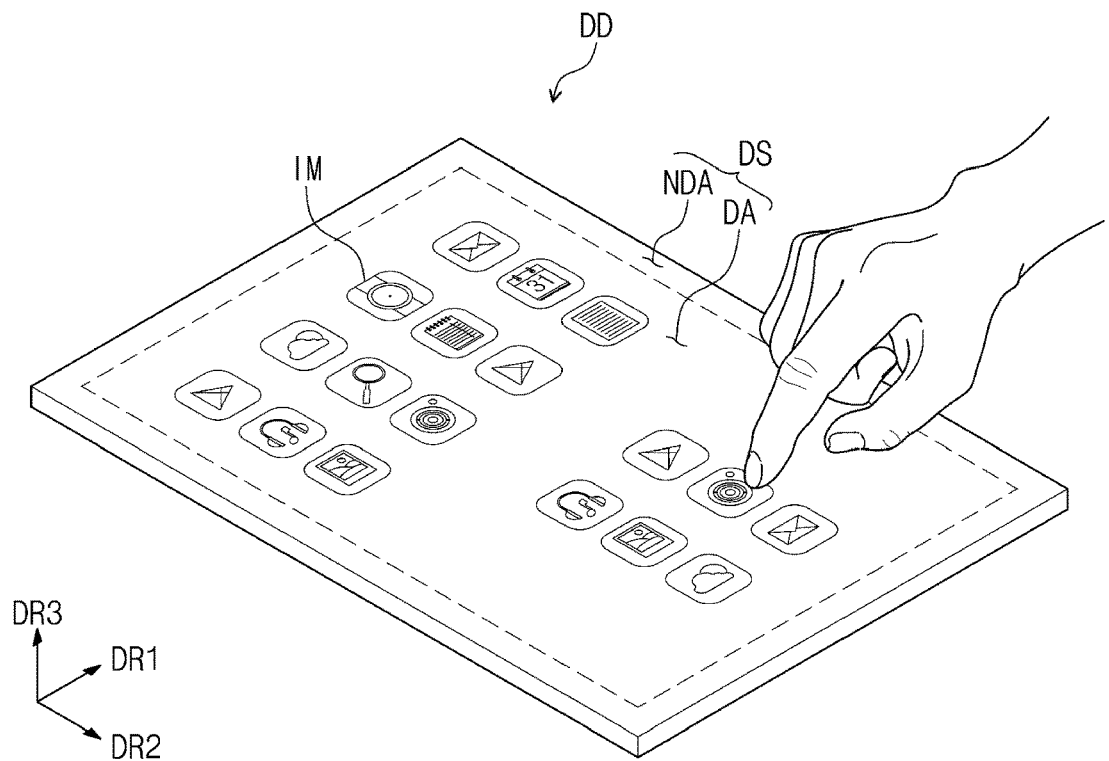
FIG. 1 is a perspective view showing a display device according to an exemplary embodiment of the present inventive concepts.

In the present inventive concepts, it will be understood that when an element or layer is referred to as being "on", "connected to" or "coupled to" another element or layer, it can be directly on, connected or coupled to the other element or layer or intervening elements or layers may be present. However, when an element or layer is referred to as being "directly on", "directly connected to" or "directly coupled to" another element or layer, no intervening elements may be disposed between the element or layer and the other element or layer.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures. However, the display device and associated elements may be inverted, rotated, etc. and exemplary embodiments of the present inventive concepts should not be limited by these terms.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments of the present inventive concepts will be described with reference to accompanying drawings.

FIG. 1 is a perspective view showing a display device DD according to an exemplary embodiment of the present inventive concepts.

Referring to the exemplary embodiment of FIG. 1, the display device DD may have a rectangular shape defined by relatively longer sides extending in a first direction DR1 and relatively shorter sides extending in a second direction DR2 that crosses the first direction DR1. However, the shape of the display device DD should not be limited to the rectangular shape and may have a variety of shapes, such as a circular shape, a polygonal shape, a three-dimensional shape, an irregular shape, etc.

Figure 4:
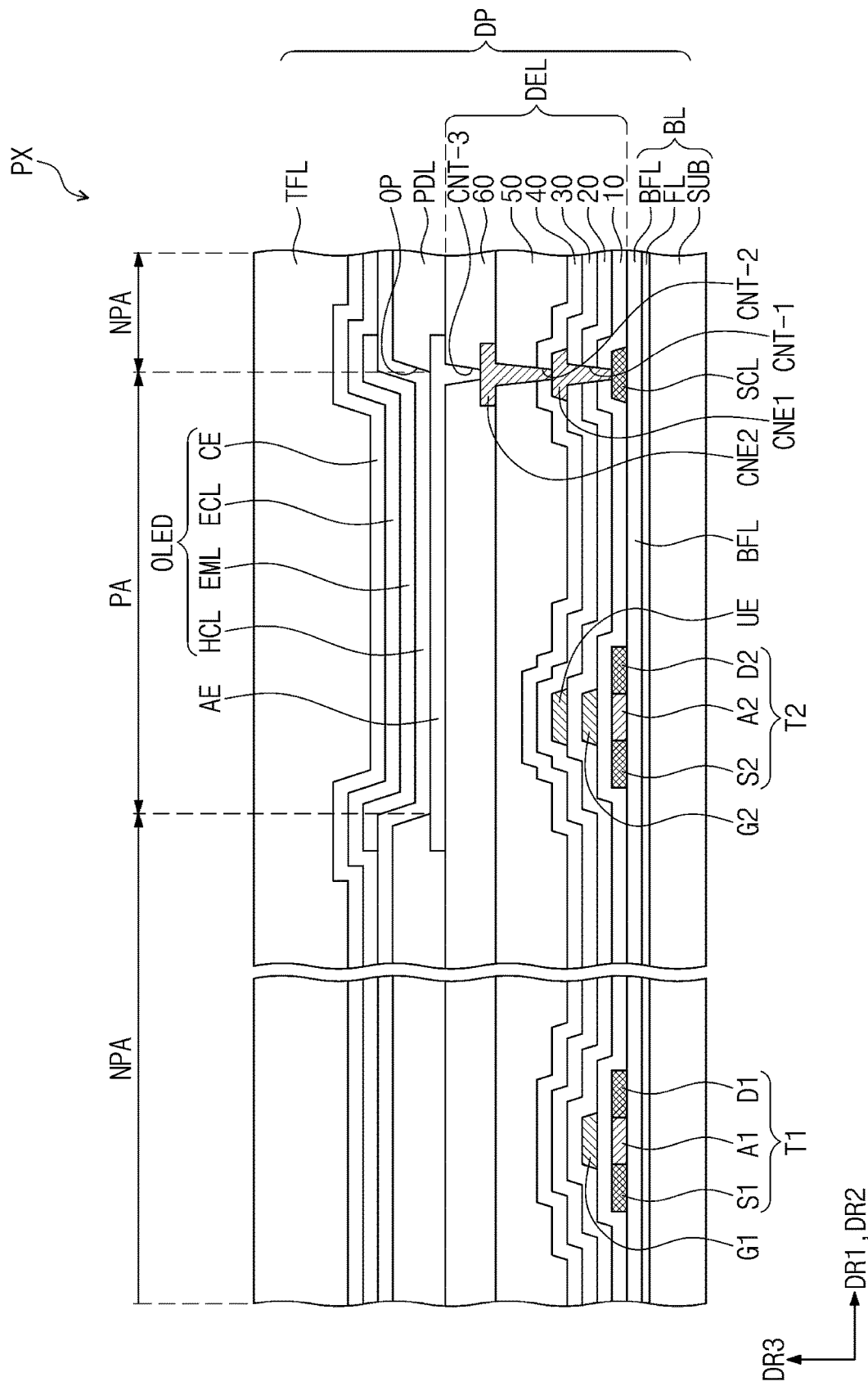
FIG. 4 is a cross-sectional view showing a pixel shown in FIG. 3 according to an exemplary embodiment of the present inventive concepts.

In the exemplary embodiment shown in FIG. 1, the first direction DR1 and the second direction DR2 are perpendicular to each other. However, exemplary embodiments of the present inventive concepts are not limited thereto. Hereinafter, a direction substantially perpendicular to a plane defined by the first direction DR1 and the second direction DR2 may be defined as a third direction DR3. The first direction DR1 and the second direction DR2 may be parallel to an upper surface of a substrate SUB (FIG. 4). The third direction DR3 may be a thickness direction of the substrate SUB. In the present disclosure, the expression "when viewed in a plane" may mean a state of being viewed from the third direction DR3.

An upper surface of the display device DD (e.g., in the third direction DR3) may be defined as a display surface DS and the display surface DS may extend in a plane defined by the first direction DR1 and the second direction DR2. Images IM generated by the display device DD may be provided to a user through the display surface DS. For example, in the exemplary embodiment of FIG. 1, the images IM displayed on the display surface DS include a plurality of icons for various software applications. However, exemplary embodiments of the present inventive concepts are not limited thereto and the display surface DS may include one or more still images and/or moving images displaying various different content.

The display surface DS may include a display area DA and a non-display area NDA surrounding the display area DA. The display area DA may display the images IM and the non-display area NDA does not display the images IM. In an exemplary embodiment, the non-display area NDA may define an edge of the display device DD, which is printed with a predetermined color. While the exemplary embodiment shown in FIG. 1 includes the non-display area NDA surrounding all four sides of the rectangular display area DA, exemplary embodiments of the present inventive concepts are not limited thereto. For example, in other exemplary embodiments, the non-display area NDA may surround three or less sides of the display area DA and the display area DA may extend to an edge of the display device DD.

Figure 2:
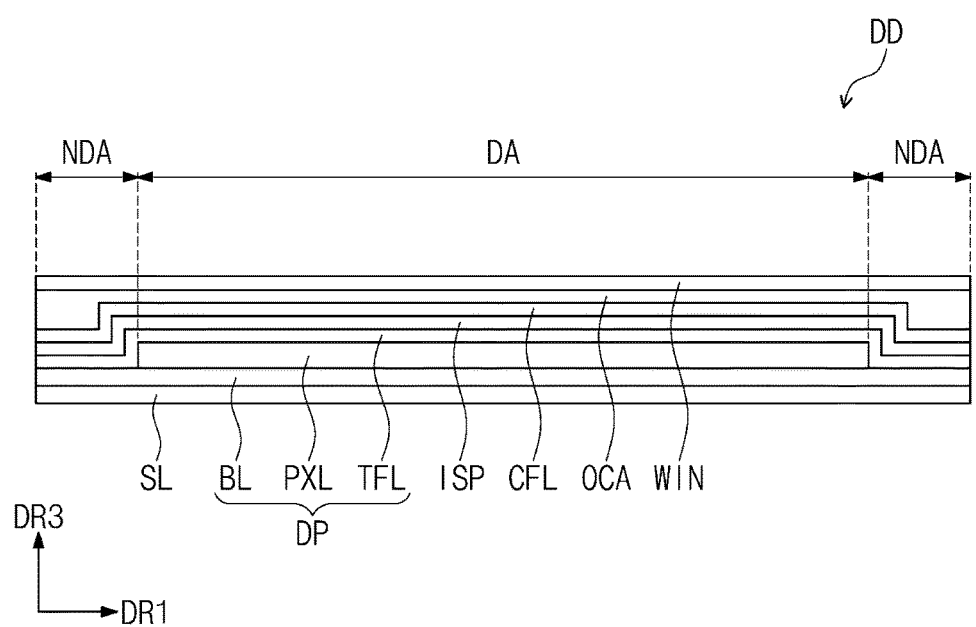
FIG. 2 is a cross-sectional view showing a display device according to an exemplary embodiment of the present inventive concepts.

FIG. 2 is a cross-sectional view schematically showing the display device DD according to an exemplary embodiment of the present inventive concepts.

Referring to the exemplary embodiment of FIG. 2, the display device DD may include a display panel DP, an input sensing unit ISP disposed on the display panel DP, a color filter layer CFL disposed on the input sensing unit ISP, a window WIN disposed on the color filter layer CFL, an adhesive OCA disposed between the color filter layer CFL and the window WIN, and a sensor layer SL disposed under the display panel DP.

The display panel DP according to an exemplary embodiment of the present inventive concepts may be a light emitting type display panel. However, exemplary embodiments of the present inventive concepts are not limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

The display panel DP may include a base layer BL, a pixel layer PXL disposed on the base layer BL, and a thin film encapsulation layer TFL disposed on the base layer BL to cover the pixel layer PXL.

The base layer BL may be disposed in the display area DA and the non-display area NDA. As shown in the exemplary embodiment of FIG. 2, the base layer BL may be disposed under the display panel DP (e.g., in the third direction DR3). In an exemplary embodiment, the base layer BL may have a multi-layer structure.

The pixel layer PXL may be disposed in the display area DA. The pixel layer PXL may include a plurality of pixels, and each of the pixels may include a light emitting element. The pixel layer PXL may not be disposed in the non-display area NDA.

In an exemplary embodiment, the thin film encapsulation layer TFL may include at least two inorganic layers and an organic layer disposed between the inorganic layers. However, exemplary embodiments of the present inventive concepts are not limited thereto, and in other exemplary embodiments, the thin film encapsulation layer TFL may include more than one organic layer. In an exemplary embodiment, the inorganic layers may include an inorganic material and may protect the pixel layer PXL from moisture/oxygen. The organic layer may include an organic material and may protect the pixel layer PXL from a foreign substance such as dust particles.

The input sensing unit ISP may sense an external input (e.g., a user's touch, etc.), may convert the external input to a predetermined input signal, and may provide the input signal to the display panel DP. The input sensing unit ISP may include a plurality of sensing electrodes to sense the external input. In an exemplary embodiment, the sensing electrodes may sense the external input by a capacitive method. The display panel DP may receive the input signal from the input sensing unit ISP and may generate an image corresponding to the input signal.

The color filter layer CFL may include a plurality of color filters. The color filters may convert the external light to a color of the color filter layer CFL.

The input sensing unit ISP and the color filter layer CFL will be described in detail later.

The window WIN may protect the display panel DP and the input sensing unit ISP from external scratches and impacts. The window WIN may be attached to the input sensing unit ISP by the adhesive OCA. The adhesive OCA may include an optical clear adhesive. The image generated by the display panel may be provided to the user after passing through the window WIN.

The sensor layer SL may be disposed under the base layer BL of the display panel DP. The sensor layer SL may include at least one sensor. For example, the sensor layer SL may include an optical fingerprint sensor. The optical fingerprint sensor may sense the light incident thereto through an optical transmission path defined through the color filter layer CFL, the input sensing unit ISP, and the display panel DP. The optical transmission path will be described in detail later.

Figure 3:
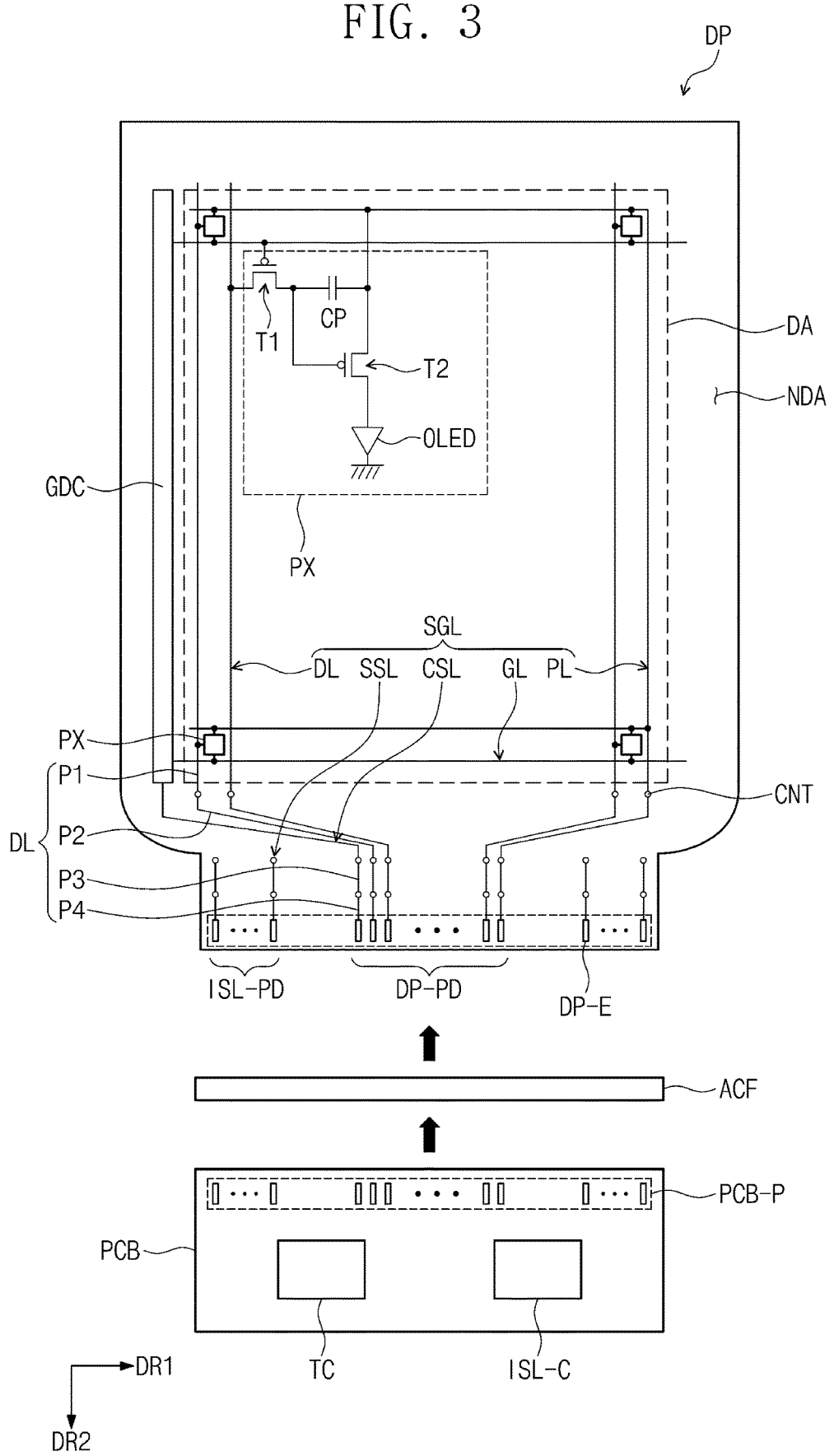
FIG. 3 is a plan view showing a display panel shown in FIG. 2 according to an exemplary embodiment of the present inventive concepts.

FIG. 3 is a plan view showing the display panel DP shown in FIG. 2 according to an exemplary embodiment of the present inventive concepts.

Referring to the exemplary embodiment of FIG. 3, the display panel DP may include a driving circuit GDC, a plurality of signal lines SGL, a plurality of signal pads DP-PD, and a plurality of pixels PX.

The driving circuit GDC may include a scan driving circuit. The scan driving circuit may generate a plurality of scan signals and may sequentially output the scan signals to a plurality of scan lines GL described later. The scan driving circuit may further output other control signals to the driving circuit of the pixels PX.

In an exemplary embodiment, the scan driving circuit may include a plurality of thin film transistors formed through the same processes, e.g., a low temperature polycrystalline silicon (LTPS) process or a low temperature polycrystalline oxide (LTPO) process, as the driving circuit of the pixels PX. However, exemplary embodiments of the present inventive concepts are not limited thereto.

As shown in the exemplary embodiment of FIG. 3, the signal lines SGL may include scan lines GL, data lines DL, a power line PL, and a control signal line CSL. Each of the scan lines GL may be connected to a corresponding pixel among the pixels PX, and each of the data lines DL may be connected to a corresponding pixel among the pixels PX. The power line PL may be connected to the pixels PX. The control signal line CSL may provide the scan driving circuit with control signals.

The signal lines SGL may include a plurality of portions disposed on different layers from each other. In the exemplary embodiment shown in FIG. 3, the data lines DL including four portions P1, P2, P3, and P4. The four portions P1, P2, P3, and P4 may be disposed on different layers and are connected to each other via contact holes CNT.

The signal pads DP-PD may be connected to the data lines DL, the power line PL, and the control signal line CSL. The signal pads DP-PD may be disposed adjacent to each other (e.g., in the first direction DR1) in a pad area DP-E defined in a portion of the non-display area NDA. For example, as shown in the exemplary embodiment of FIG. 3, the pad area DP-PD may be defined in a lower portion (e.g., in the second direction DR2) of the non-display area NDA. The signal pads DP-PD may be formed through the same process without distinguishing their stacked structures or constituent materials from each other.

The display area DA may be defined as an area in which the pixels PX are arranged. A plurality of electronic elements is arranged in the display area DA. The electronic elements may include an organic light emitting diode and the pixel driving circuit connected to the organic light emitting diode, which are disposed in each pixel PX.

In an exemplary embodiment, the pixel PX may include a first transistor T1, a second transistor T2, a capacitor CP, and an light emitting diode OLED. While the pixel driving circuit of the pixel PX includes a switching transistor and a driving transistor, exemplary embodiments of the pixel driving circuit are not limited to the exemplary embodiment shown in FIG. 3. The first transistor T1 may be connected to the scan line GL and the data line DL. The light emitting diode OLED may receive a power voltage provided through the power line PL.

FIG. 3 further shows a circuit board PCB electrically connected to the display panel DP according to an exemplary embodiment of the present inventive concepts. The circuit board PCB may be a rigid circuit board or a flexible circuit board.

A timing control circuit TC may be disposed on the circuit board PCB to control an operation of the display panel DP. In addition, an input sensing circuit ISL-C may be disposed on the circuit board PCB to control an input sensor. In an exemplary embodiment, each of the timing control circuit TC and the input sensing circuit ISL-C may be mounted on the circuit board PCB in an integrated chip form. For example, in an exemplary embodiment of the present inventive concepts, the timing control circuit TC and the input sensing circuit ISL-C may be mounted on the circuit board PCB in one integrated chip form. The circuit board PCB may include circuit board pads PCB-P electrically connected to the signal pads DP-PD. The circuit board PCB may further include signals lines that connect the circuit board pads PCB-P and the timing control circuit TC and/or the input sensing circuit ISL-C. In addition, the circuit board pads PCB-P may be output pads, and the circuit board PCB may further include input pads.

The signal pads DP-PD of the display panel DP may be electrically connected to the circuit board pads PCB-P by a conductive member, such as an anisotropic conductive film ACF. However, exemplary embodiments of the present inventive concepts are not limited thereto. For example, in an exemplary embodiment, the anisotropic conductive film ACF may be replaced with a conductive ball.

The display panel DP shown in the exemplary embodiment of FIG. 3 may be partially bent. For example, a portion of the non-display area NDA may be bent with respect to a bending axis substantially parallel to the first direction DR1. The bending axis may be defined to overlap the third portions P3 of the data lines DL.

FIG. 4 is a cross-sectional view showing the pixel PX shown in FIG. 3 according to an exemplary embodiment of the present inventive concepts.

Referring to the exemplary embodiment of FIG. 4, the display panel DP may include the base layer BL, an element layer DEL, a pixel definition layer PDL, a plurality of light emitting elements OLED, and the thin film encapsulation layer TFL. As shown in the exemplary embodiment of FIG. 2, the pixel layer PXL may be defined by the element layer DEL, the pixel definition layer PDL, and the light emitting elements OLED disposed between the base layer BL and the thin film encapsulation layer TFL.

The base layer BL may include a plurality of layers. For example, as shown in the exemplary embodiment of FIG. 4, the base layer BL may include a substrate SUB, a functional layer FL, and a buffer layer BFL consecutively stacked (e.g., in the third direction DR3). However, exemplary embodiments of the present inventive concepts are not limited thereto.

Figure 5:
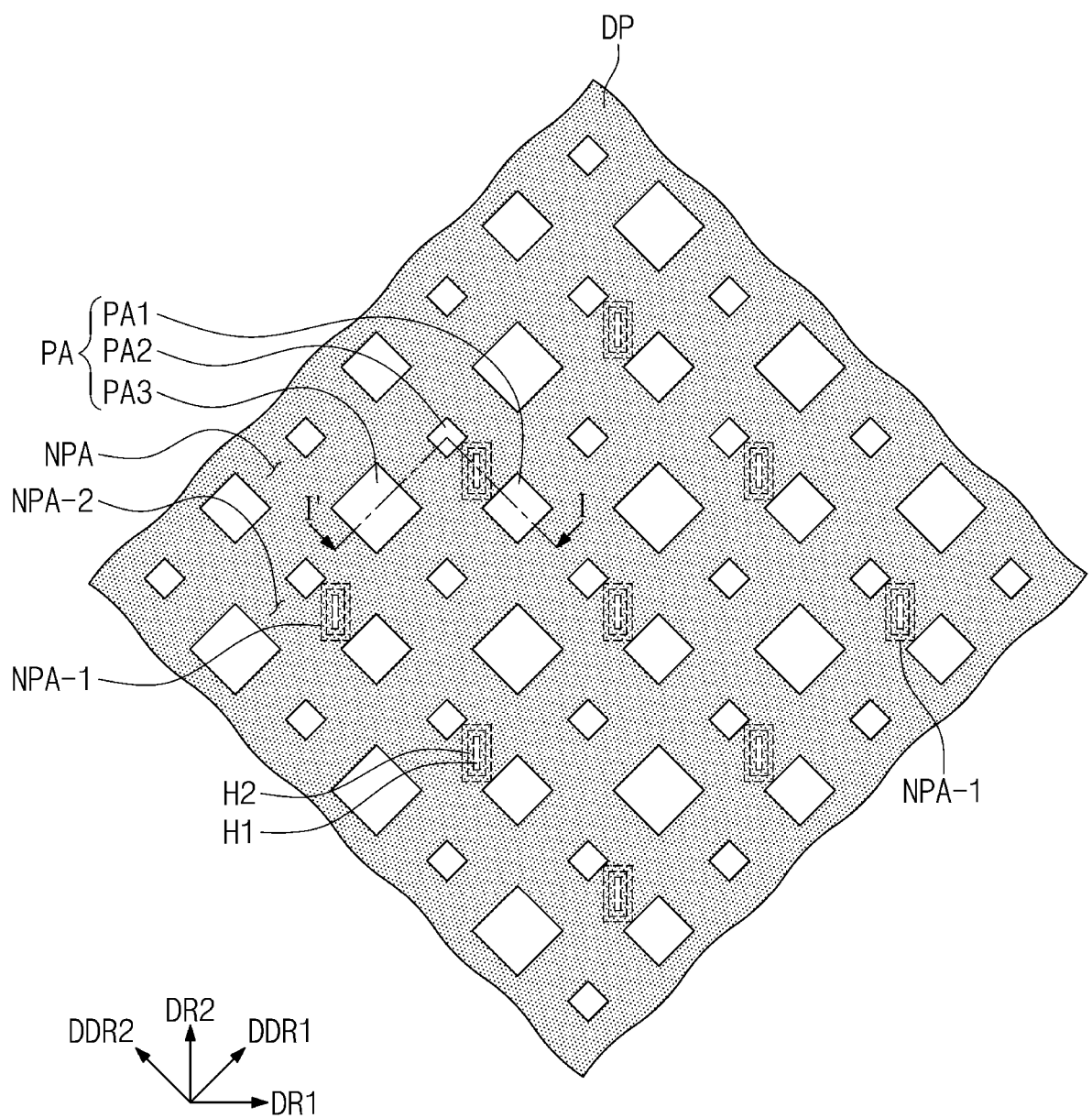
FIG. 5 is a plan view showing a structure in which a pixel area shown in FIG. 4 is disposed in plural according to an exemplary embodiment of the present inventive concepts.

The substrate SUB may include a plurality of pixel areas PA and a non-pixel area NPA around each pixel area PA. For convenience of illustration, FIG. 4 shows only one pixel area PA, however, a plurality of pixel areas PA may be defined in the substrate SUB as shown in FIG. 5. The non-pixel area NPA may be disposed to surround each pixel area PA.

In an exemplary embodiment, the substrate SUB may be a transparent substrate and may include a flexible plastic substrate. For example, the substrate SUB may include polyimide (PI). However, exemplary embodiments of the present inventive concepts are not limited thereto.

As shown in the exemplary embodiment of FIG. 4, a lower surface of the functional layer FL may be disposed directly on an upper surface of the substrate SUB. The functional layer FL may block light. For example, the functional layer FL may have a black color that absorbs the light. The functional layer FL may block the light incident to the substrate SUB to prevent components disposed under the substrate SUB from being viewed.

The buffer layer BFL may improve a coupling force between the substrate SUB and a semiconductor pattern. In an exemplary embodiment, the buffer layer BFL may include a silicon oxide layer and a silicon nitride layer. The silicon oxide layer and the silicon nitride layer may be alternately stacked with each other. However, exemplary embodiments of the present inventive concepts are not limited thereto.

The semiconductor pattern may be disposed on the buffer layer BFL. In an exemplary embodiment, the semiconductor pattern may include polysilicon. However, exemplary embodiments of the present inventive concepts are not limited thereto or thereby. The semiconductor pattern may include amorphous silicon or metal oxide.

As shown in the exemplary embodiment of FIG. 4, the element layer DEL may include a first transistor T1, a second transistor T2, a first insulating layer 10, a second insulating layer 20, a third insulating layer 30, a fourth insulating layer 40, a fifth insulating layer 50, and a sixth insulating layer 60.

A first source S1, a first active A1, and a first drain D1 of the first transistor T1 may be formed using the semiconductor pattern, and a second source S2, a second active A2, and a second drain D2 of the second transistor T2 may be formed using the semiconductor pattern. The first and second sources S1 and S2 and the first and second drains D1 and D2 may extend in opposite directions (e.g., in the first direction DR1) from the first and second actives A1 and A2. FIG. 4 shows a portion of a connection signal line SCL formed using the semiconductor pattern. In an exemplary embodiment, the connection signal line SCL may be connected to the second drain D2 of the second transistor T2 when viewed in a plane (e.g., in a plane defined in the first direction DR1 and third direction DR3).

The first insulating layer 10 may be disposed on the buffer layer BFL. The first insulating layer 10 may commonly overlap the pixels PX and may cover the semiconductor pattern. For example, as shown in the exemplary embodiment of FIG. 4, a lower surface of the first insulating layer 10 may directly contact an upper surface of the buffer layer BFL and upper and side surfaces of the first and second sources S1, S2, first and second drains D1, D2, first and second actives A1, A2 and the connection signal line SCL. The first insulating layer 10 may include an inorganic layer and/or an organic layer and may have a single-layer or multi-layer structure. In an exemplary embodiment, the first insulating layer 10 may include at least one compound selected from aluminum oxide, titanium oxide, silicon oxide, silicon oxynitride, zirconium oxide, and hafnium oxide. However, exemplary embodiments of the present inventive concepts are not limited thereto. In the present exemplary embodiment, the first insulating layer 10 may be a single silicon oxide layer.

First and second gates G1 and G2 may be disposed on the first insulating layer 10. The first and second gates G1 and G2 may be a portion of a metal pattern. The first and second gates G1 and G2 overlap (e.g., in the third direction DR3) the first and second actives A1 and A2, respectively. The first and second gates G1 and G2 may act as a mask in a doping process of the semiconductor pattern.

The second insulating layer 20 may be disposed on the first insulating layer 10 to cover the first and second gates G1 and G2. The second insulating layer 20 may commonly overlap the pixels PX. For example, as shown in the exemplary embodiment of FIG. 4, a lower surface of the second insulating layer 20 may directly contact an upper surface of the first insulating layer 10 and upper and side surfaces of the first and second gates G1, G2. The second insulating layer 20 may include an inorganic layer and/or an organic layer and may have a single-layer or multi-layer structure. In an exemplary embodiment, the second insulating layer 20 may be a single silicon oxide layer. However, exemplary embodiments of the present inventive concepts are not limited thereto.

An upper electrode UE may be disposed on the second insulating layer 20. The upper electrode UE may overlap (e.g., in the third direction DR3) the second gate G2 of the second transistor T2. The upper electrode UE may be a portion of the metal pattern. The portion of the second gate G2 and the upper electrode UE overlapping the portion of the second gate G2 may define the capacitor CP (refer to FIG. 3). However, exemplary embodiments of the present inventive concepts are not limited thereto. For example, in other exemplary embodiments of the present inventive concepts, the upper electrode UE may be omitted.

The third insulating layer 30 may be disposed on the second insulating layer 20 to cover the upper electrode UE. For example, as shown in the exemplary embodiment of FIG. 4, a lower surface of the third insulating layer 30 may directly contact an upper surface of the second insulating layer 20 and upper and side surfaces of the upper electrode UE. In an exemplary embodiment, the third insulating layer 30 may be a single silicon oxide layer. A first connection electrode CNE1 may be disposed on the third insulating layer 30. The first connection electrode CNE1 may be connected to the connection signal line SCL through a first contact hole CNT-1 penetrating through the first to third insulating layers 10 to 30.

The fourth insulating layer 40 may be disposed on the third insulating layer 30. For example, as shown in the exemplary embodiment of FIG. 4, a lower surface of the fourth insulating layer 40 may directly contact an upper surface of the third insulating layer 30 and upper and side surfaces of the first connection electrode CNE1. In an exemplary embodiment, the fourth insulating layer 40 may be a single silicon oxide layer. The fifth insulating layer 50 may be disposed on the fourth insulating layer 40. In an exemplary embodiment, the fifth insulating layer 50 may be an organic layer. A second connection electrode CNE2 may be disposed on the fifth insulating layer 50. The second connection electrode CNE2 may be connected to the first connection electrode CNE1 through a second contact hole CNT-2 penetrating through the fourth and fifth insulating layers 40 and 50.

The sixth insulating layer 60 may be disposed on the fifth insulating layer 50 to cover the second connection electrode CNE2. For example, as shown in the exemplary embodiment of FIG. 4, a lower surface of the sixth insulating layer 60 may directly contact an upper surface of the fifth insulating layer 50 and upper and side surfaces of the second connection electrode CNE2. In an exemplary embodiment, the sixth insulating layer 60 may be an organic layer. The light emitting element OLED may be disposed on the sixth insulating layer 60. A first electrode AE of the light emitting element OLED may be connected to the second connection electrode CNE2 through a third contact hole CNT-3 penetrating through the sixth insulating layer 60. A plurality of pixel openings OP may be defined through the pixel definition layer PDL. At least a portion of the first electrode AE may be exposed through the pixel opening OP of the pixel definition layer PDL.

The pixel definition layer PDL may be disposed on the element layer DEL. For example, the pixel definition layer PDL may be disposed on the sixth insulating layer 60 and lateral ends of the first electrode AE. The pixel definition layer PDL may overlap the non-pixel area NPA of the substrate SUB. The plurality of pixel openings OP may be defined through the pixel definition layer PDL to overlap the pixel areas PA.

In the present exemplary embodiment, the pixel definition layer PDL may block the light incident thereto. For example, the pixel definition layer PDL may have a black color.

The light emitting elements OLED may be disposed in the pixel openings OP defined through the pixel definition layer PDL. As shown in the exemplary embodiment of FIG. 4, the light emitting elements OLED may include the first electrode AE, a hole control layer HCL, a light emitting layer EML, an electron control layer ELC, and a second electrode CE.

The hole control layer HCL may be commonly disposed to overlap the pixel area PA and the non-pixel area NPA of the substrate SUB. In an exemplary embodiment, the hole control layer HCL may include a hole transport layer and may further include a hole injection layer. The light emitting layer EML may be disposed on the hole control layer HCL. The light emitting layer EML may be disposed in an area corresponding to the pixel opening OP. For example, the light emitting layer EML may be formed in each of the pixels after being divided into plural portions.

The electron control layer ECL may be disposed on the light emitting layer EML. The electron control layer ECL may include an electron transport layer and may further include an electron injection layer. In an exemplary embodiment, the hole control layer HCL and the electron control layer ECL may be commonly formed in a plurality of pixels using an open mask. The second electrode CE may be disposed on the electron control layer ECL. The second electrode CE may have a single unitary form and may be commonly disposed in the plurality of pixels PX. The thin film encapsulation layer TFL may be disposed on the second electrode CE.

Figure 6:
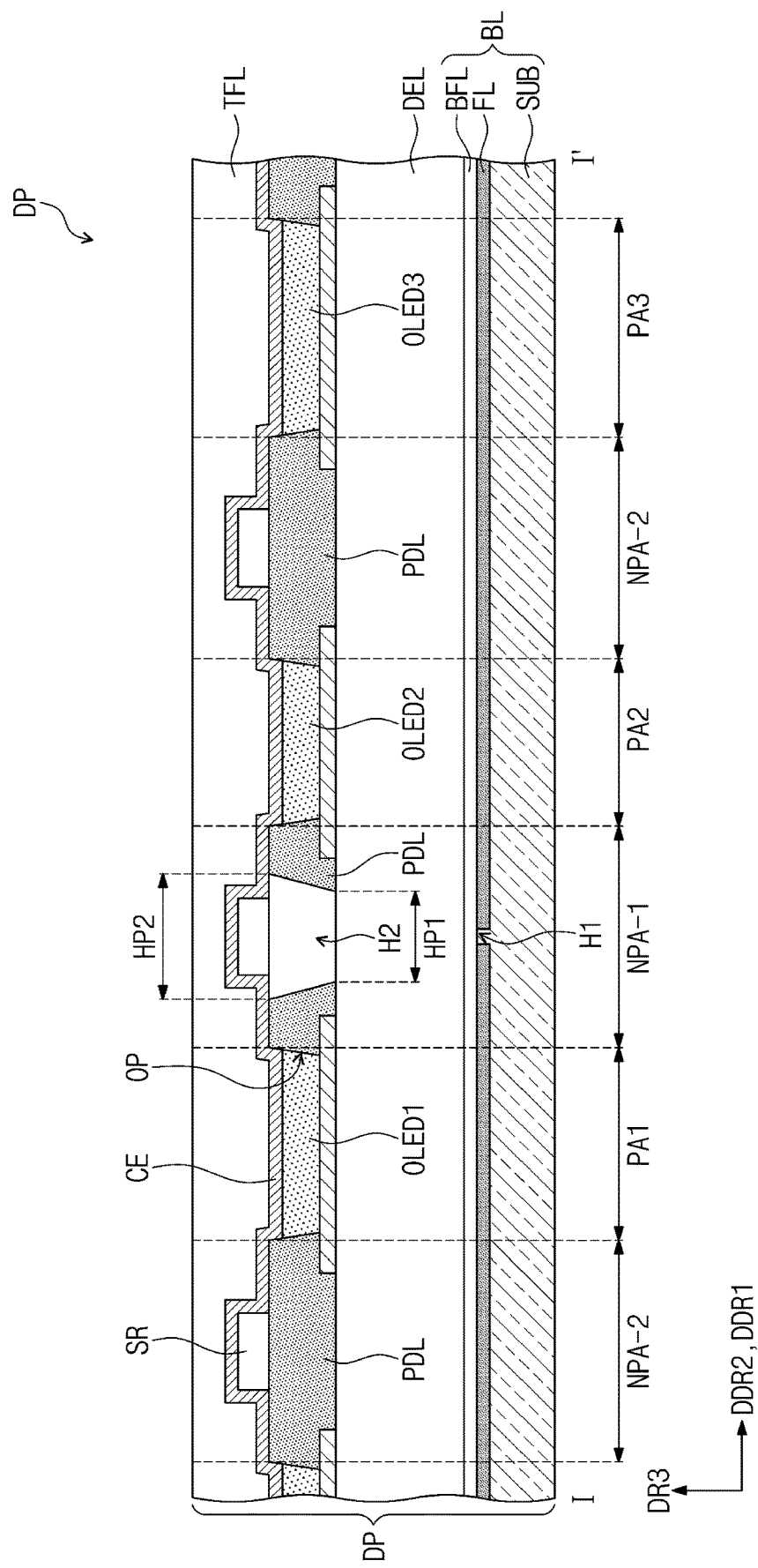
FIG. 6 is a cross-sectional view taken along a line I-I' of FIG. 5 according to an exemplary embodiment of the present inventive concepts.

FIG. 5 is a plan view showing a structure in which the pixel area shown in FIG. 4 is disposed in plural, and FIG. 6 is a cross-sectional view taken along a line I-I' shown in FIG. 5.

For convenience of explanation, FIG. 6 schematically shows the element layer DEL and the light emitting elements OLED.

Referring to the exemplary embodiment of FIG. 5, the pixel areas PA may be arranged along a diagonal direction. For example, the pixel areas PA may be arranged along a first diagonal direction DDR1 or a second diagonal direction DDR2 to be spaced apart from each other.

The first diagonal direction DDR1 may be defined as a direction inclined with respect to the first and second directions DR1 and DR2 on a plane defined by the first and second directions DR1 and DR2. The second diagonal direction DDR2 may be defined as a direction crossing the first diagonal direction DDR1 on the plane defined by the first and second directions DR1 and DR2. For example, in an exemplary embodiment, the first direction DR1 and the second direction DR2 may perpendicularly cross each other, and the first diagonal direction DDR1 and the second diagonal direction DDR2 may perpendicularly cross each other. However, exemplary embodiments of the present inventive concepts are not limited thereto.

The pixel areas PA may include first pixel areas PA1, second pixel areas PA2, and third pixel areas PA3. In an exemplary embodiment, the display panel DP may emit light of different colors from each other in the first, second, and third pixel areas PA1, PA2, and PA3, respectively. For example, in an exemplary embodiment, the display panel DP may emit a red color in the first pixel areas PA1, the display panel DP may emit a green color in the second pixel areas PA2, and the display panel DP may emit a blue color in the third pixel areas PA3. However, exemplary embodiments of the present inventive concepts are not limited thereto and the colors emitted by the display panel DP in the first to third pixel areas PA1, PA2, and PA3 may vary.

When viewed in a plane (e.g., in a plane defined by the first direction DR1 and second direction DR2), each of the first, second, and third pixel areas PA1, PA2, and PA3 may have a polygonal shape. For example, when viewed in a plane, each of the first, second, and third pixel areas PA1, PA2, and PA3 may have a lozenge shape. However, exemplary embodiments of the present inventive concepts are not limited thereto and the shape of the pixel areas PA may vary.

In an exemplary embodiment, the first, second, and third pixel areas PA1, PA2, and PA3 may have different sizes from each other. For example, as shown in the exemplary embodiment of FIG. 5 the third pixel area PA3 may have the largest size (e.g., area in a plane defined by the first direction DR1 and the second direction DR2), the second pixel area PA2 may have the smallest size, and the first pixel area PA1 may have an intermediate size between the second pixel area PA2 and the third pixel area PA3. However, exemplary embodiments of the present inventive concepts are not limited thereto and a relationship in size between the first to third pixel areas PA1, PA2, and PA3 may vary. For example, the first to third pixel areas PA1, PA2, and PA3 may have the same size when viewed in a plane.

The non-pixel area NPA may surround the pixel areas PA. The non-pixel area NPA may include a plurality of first areas NPA-1 and a plurality of second areas NPA-2.

The first areas NPA-1 of the non-pixel area NPA may be defined in a partial portion of an area between the first pixel areas PA1 and the second pixel areas PA2. However, the first areas NPA-1 may not be disposed in the entire space between the first pixel areas PA1 and the second pixel areas PA2. In an exemplary embodiment, the first areas NPA-1 may be designed and arranged in a predetermined number per unit area.

Referring to the exemplary embodiment of FIG. 6, the light emitting elements OLED may include first light emitting elements OLED1, second light emitting elements OLED2, and third light emitting elements OLED3.

The first, second, and third light emitting elements OLED1, OLED2, and OLED3 may generate lights having different colors from each other. For example, in an exemplary embodiment, the first light emitting elements OLED1 may generate light having a red color, the second light emitting elements OLED2 may generate light having a green color, and the third light emitting elements OLED3 may generate light having a blue color. However, exemplary embodiments of the present inventive concepts are not limited thereto and the colors of the lights generated by the first, second, and third light emitting elements OLED1, OLED2, and OLED3 may vary. For example, in another exemplary embodiment, the first, second, and third light emitting elements OLED1, OLED2, and OLED3 may generate lights having magenta, cyan, or white colors.

The light emitting elements OLED may overlap (e.g., in the third direction D3) the pixel areas PA of the substrate SUB. For example, as shown in the exemplary embodiment of FIG. 6, the first light emitting elements OLED1 may overlap the first pixel areas PA1, the second light emitting elements OLED2 may overlap the second pixel areas PA2, and the third light emitting elements OLED3 may overlap the third pixel areas PA3. The pixel definition layer PDL may overlap (e.g., in the third direction DR3) the non-pixel area NPA.

A plurality of first holes H1 (refer to FIG. 5) may be defined through the functional layer FL. The first holes H1 may overlap the first areas NPA-1 of the non-pixel area NPA of the substrate SUB.

A plurality of second holes H2 may be defined through the pixel definition layer PDL. The second holes H2 may overlap (e.g., in the third direction DR3) the first holes H1 and the first areas NPA-1 of the substrate SUB. In an exemplary embodiment, each of the first holes H1 and each of the second holes H2 has a polygonal shape or a circular shape when viewed in a plane (e.g., a plane defined by the first direction DR1 and the second direction DR2).

Each of the second holes H2 may include a first portion HP1 and a second portion HP2. The first portion HP1 may be positioned on a lower end (e.g., in the third direction DR3) of the second hole H2, and the second portion HP2 may be positioned on an upper end (e.g., in the third direction DR3) of the second hole H2. As shown in the exemplary embodiment of FIG. 6, a width of the second portion HP2 may be greater than a width of the first portion HP1. For example, each of the second holes H2 may have a shape in which the width thereof becomes narrower as the distance to the substrate SUB (e.g., in the third direction DR3) decreases from the second portion HP2 to the first portion HP1. In an exemplary embodiment, the second holes H2 may be filled with a transparent insulating material. For example, the second holes H2 may be filled with an insulating material such as spacers SR.

According to the present exemplary embodiment, the first area NPA-1 may be defined as a light transmitting area. Lights incident to the first area NPA-1 may reach the sensor layer SL (refer to FIG. 2) disposed under the substrate SUB after passing through the second holes H2 and the first holes H1. In the display panel DP, the first holes H1 and the second holes H2 may be defined as the optical transmission path.

According to the exemplary embodiment of the present inventive concepts, the spacers SR may be disposed on the pixel definition layer PDL. The spacers SR may include a transparent material. For example, in an exemplary embodiment, the spacers SR may include a transparent organic insulating material. The spacers SR may protect the first to third light emitting elements OLED1, OLED2, and OLED3 and the element layer DEL to prevent the display characteristics of the display panel DP from deteriorating. For example, the spacers SR may buffer external forces acting on the first to third light emitting elements OLED1, OLED2, and OLED3. While the exemplary embodiment of FIG. 6 includes the spacers SR disposed on the pixel definition layer PDL and overlapping (e.g., in the third direction DR3) both the first area NPA-1 and the second area NPA-2, exemplary embodiments of the present inventive concepts are not limited thereto. In an exemplary embodiment, the spacers SR may be disposed on the pixel definition layer PDL and overlap at least one area selected from the first area NPA-1 and the second area NPA-2.

Figure 7:
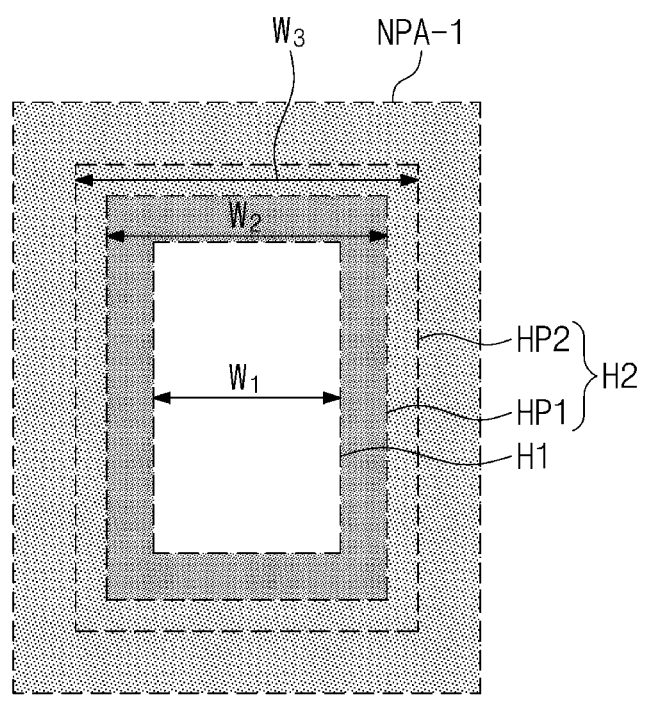
FIG. 7 is a plan view showing first areas shown in FIG. 5 according to an exemplary embodiment of the present inventive concepts.
Figure 8:
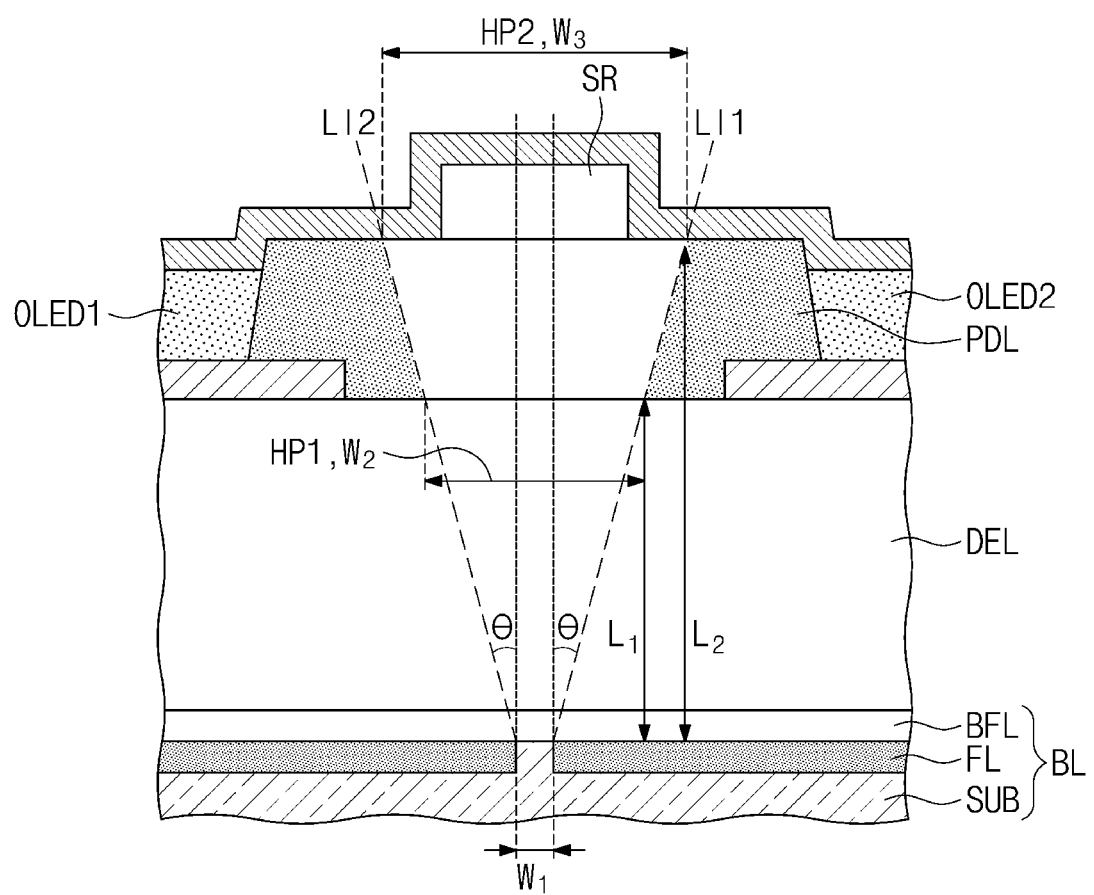
FIG. 8 is a cross-sectional view showing a first area shown in FIG. 5 according to an exemplary embodiment of the present inventive concepts.

FIG. 7 is a view showing the first areas shown in FIG. 5 when viewed in a plane defined in the first direction DR1 and the second direction DR2, and FIG. 8 is a cross-sectional view showing the first area shown in FIG. 5.

Referring to the exemplary embodiments of FIGS. 7 and 8, the first holes H1 defined through the functional layer FL and the second holes H2 defined through the pixel definition layer PDL may overlap the first areas NPA-1 of the substrate SUB (e.g., in the third direction DR3). When viewed in a plane (e.g., defined by the first direction DR1 and the second direction DR2), each of the second holes H2 may have a size that is greater than the size of each of the first holes H1. For example, the area of the second holes H2 in the plane defined by the first direction DR1 and the second direction DR2 may be larger than the area of the first holes H1.

As shown in the exemplary embodiment of FIG. 7, the first hole H1 may have a first width W1 in the first direction DR1. The first width W1 may have a predetermined size. For example, the first width W1 may be a few micrometers. For example, the first width W1 may be 2-7 micrometers. However, exemplary embodiments of the present inventive concepts are not limited thereto.

The first portion HP1 and the second portion HP2 of the second hole H2 may have a second width W2 and a third width W3, respectively. As shown in the exemplary embodiment of FIG. 7, the third width W3 may be greater than the second width W2. In an exemplary embodiment, the second width W2 and the third width W3 may be determined depending on a size of the first width W1, a distance from the first hole H1, and an incident angle θ of the light.

For example, the second width W2 and the third width W3 may satisfy the following Equations 1 and 2.

$$W2 > W1 + 2 \times L1 \times \tan(W1) \quad \text{Equation 1}$$

$$W3 > W1 + 2 \times L2 \times \tan(\theta) \quad \text{Equation 2}$$

In Equations 1-2, W1 denotes a width in the first direction DR1 of the first hole H1. W2 denotes a width in the first direction DR1 of the first portion HP1 of the second hole H2. W3 denotes a width in the first direction DR1 of the second portion HP2 of the second hole H2.

A first distance L1 may be a vertical distance (e.g., length in the third direction DR3) from the first hole H1 to the first portion HP1. For example, the first distance L1 may be a vertical distance from the functional layer FL to a lower end of the pixel definition layer PDL. A second distance L2 may be a vertical distance from the first hole H1 to the second portion HP2. For example, the second distance L2 may be a vertical distance from the functional layer FL to an upper end of the pixel definition layer PDL.

The incident angle θ may be a maximum angle formed by the lights incident to the first holes H1 and the vertical direction DR3. For example, as shown in the exemplary embodiment of FIG. 8, a first path LI1 of a first light and a second path LI2 of a second light may form the incident angle θ with the vertical direction (e.g., the third direction DR3). The first path LI1 of the first light and the second path LI2 of the second light may form the maximum angle among the paths of the lights incident to the first hole H1. The lights incident to the first and second holes H1 and H2 may be incident along a path defined between the first light path LI1 and the second light path LI2.

The lights incident through the optical transmission path may be lights that are generated by the first to third light emitting elements OLED1, OLED2, and OLED3 and incident to the display panel DP again after being reflected from an external object.

In an exemplary embodiment, the widths in the second direction DR2 of the first portion HP1 and the second portion HP2 of the second hole H2 may satisfy Equations 1-2.

For example, the widths in the second direction DR2 of the first portion HP1 and the second portion HP2 may be determined depending on the width in the second direction DR2 of the first hole H1, a distance from the first hole H1 to the first portion HP1 or the second portion HP2, and the maximum angle formed by the lights incident to the first hole H1 and the vertical direction.

Figure 9:
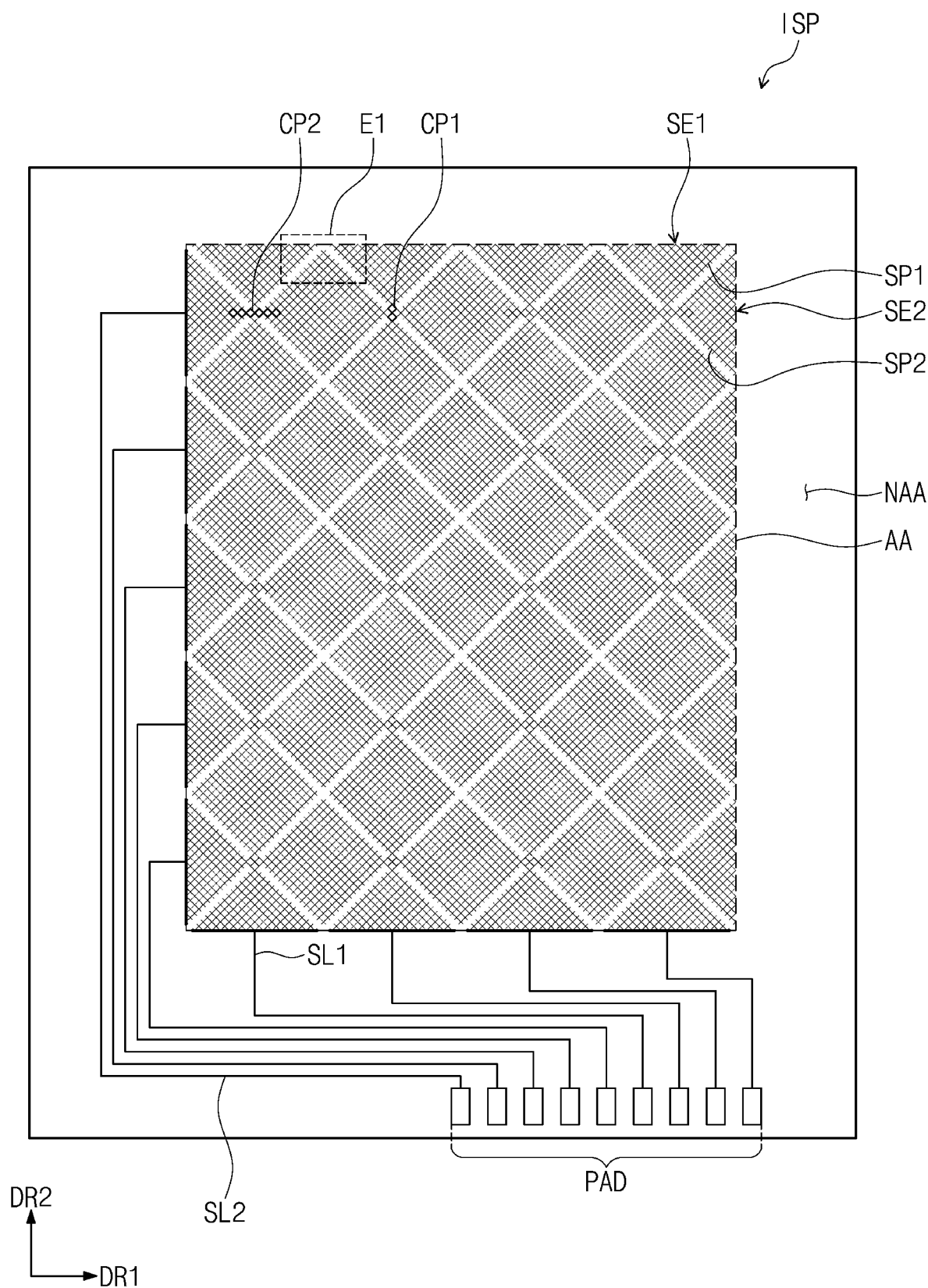
FIG. 9 is a plan view showing an input sensing unit shown in FIG. 2 according to an exemplary embodiment of the present inventive concepts.

FIG. 9 is a plan view showing the input sensing unit ISP shown in FIG. 2 according to an exemplary embodiment of the present inventive concepts.

Referring to the exemplary embodiment of FIG. 9, the input sensing unit ISP may include a plurality of first and second sensing electrodes SE1 and SE2, a plurality of first and second lines SL1 and SL2, and a plurality of pads PD. The first and second sensing electrodes SE1 and SE2, the first and second lines SL1 and SL2, and the pads PD may be disposed on the thin film encapsulation layer TFL.

The input sensing unit ISP may include an active area AA and a non-active area NAA surrounding the active area AA when viewed in a plane (e.g., a plane defined in the first direction DR1 and the second direction DR2). The first and second sensing electrodes SE1 and SE2 may be disposed in the active area AA, and the pads PD may be disposed in the non-active area NAA. The first and second lines SL1 and SL2 may be connected to the first and second sensing electrodes SE1 and SE2 and may extend to the non-active area NAA to be connected to the pads PD.

In an exemplary embodiment, the pads PD may be connected to a driver that drives the input sensing unit ISP through a flexible printed circuit board.

The first and second sensing electrodes SE1 and SE2 may include a plurality of first sensing electrodes SE1 extending in the second direction DR2 and arranged in the first direction DR1 and a plurality of second sensing electrodes SE2 extending in the first direction DR1 and arranged in the second direction DR2. The first and second lines SL1 and SL2 may include a plurality of first signal lines SL1 connected to the first sensing electrodes SE1 and a plurality of second signal lines SL2 connected to the second sensing electrodes SE2.

The second sensing electrodes SE2 may extend to cross the first sensing electrodes SE1 and may be insulated from the first sensing electrodes SE1. In an exemplary embodiment, the first sensing electrodes SE1 may be defined as output sensing electrodes, and the second sensing electrodes SE2 may be defined as input sensing electrodes.

Each of the first sensing electrodes SE1 may include a plurality of first sensor portions SP1 arranged in the second direction DR2 and a plurality of first connection portions CP1 connecting the first sensor portions SP1. Each of the first connection portions CP1 may be disposed between two first sensor portions SP1 adjacent to each other (e.g., in the second direction DR2) and may electrically connect the two first sensor portions SP1.

Each of the second sensing electrodes SE2 may include a plurality of second sensor portions SP2 arranged in the first direction DR1 and a plurality of second connection portions CP2 connecting the second sensor portions SP2. Each of the second connection portions CP2 may be disposed between two second sensor portions SP2 adjacent to each other (e.g., in the first direction DR1) and may electrically connect the two second sensor portions SP2.

In an exemplary embodiment, the first sensor portions SP1 and the second sensor portions SP2 may have a mesh shape. The first sensor portions SP1 and the second sensor portions SP2 may not overlap each other (e.g., in the third direction DR3), may be spaced apart from each other (e.g., in the first direction DR1 and second direction DR2), and may be alternately arranged with each other. The second connection portions CP2 may be insulated from the first connection portions CP1 while crossing the first connection portions CP1.

In an exemplary embodiment, the first and second sensor portions SP1 and SP2 and the first connection portions CP1 may be disposed on the same layer. The second connection portions CP2 may be disposed on a layer that is different from the layer on which the first and second sensor portions SP1 and SP2 and the first connection portions CP1 are disposed.

The first signal lines SL1 may be respectively connected to first ends of the first sensing electrodes SE1 and may extend to the non-active area NAA to be connected to the pads PD. For example, as shown in the exemplary embodiment of FIG. 9, the first ends of the first sensing electrodes SE1 may be lower ends (e.g., in the second direction DR2) of the first sensing electrodes SEL. However, exemplary embodiments of the present inventive concepts are not limited thereto. The second signal lines SL2 may be respectively connected to first ends of the second sensing electrodes SE2 and may extend to the non-active area NAA to be connected to the pads PD. For example, as shown in the exemplary embodiment of FIG. 9, the first ends of the second sensing electrodes SE2 may be leftmost ends (e.g., in the first direction DR1) of the second sensing electrodes SE2. However, exemplary embodiments of the present inventive concepts are not limited thereto.

Figure 10:
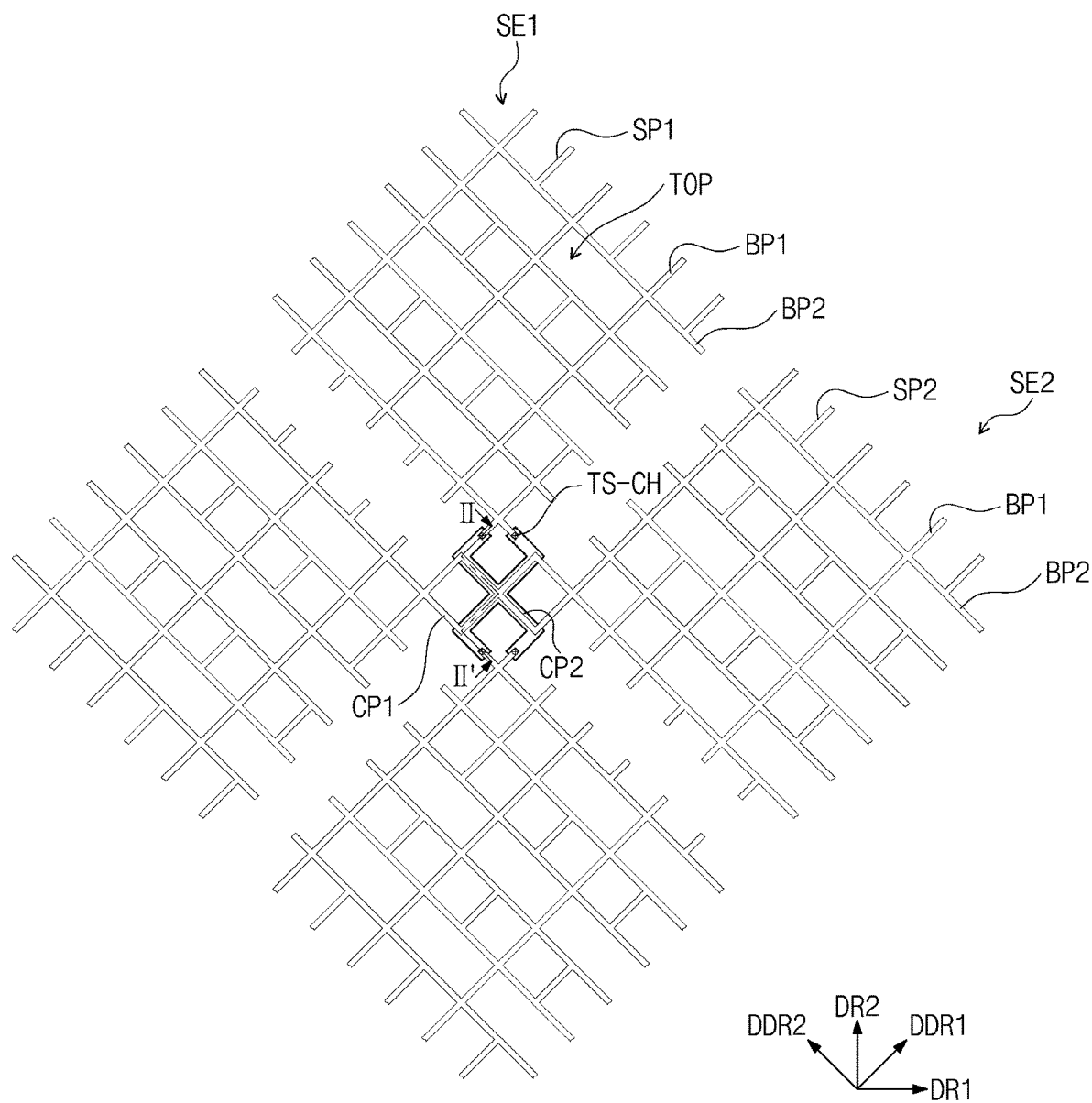
FIG. 10 is an enlarged plan view showing a configuration of the first and second sensor portions shown in FIG. 9 according to an exemplary embodiment of the present inventive concepts.
Figure 11:
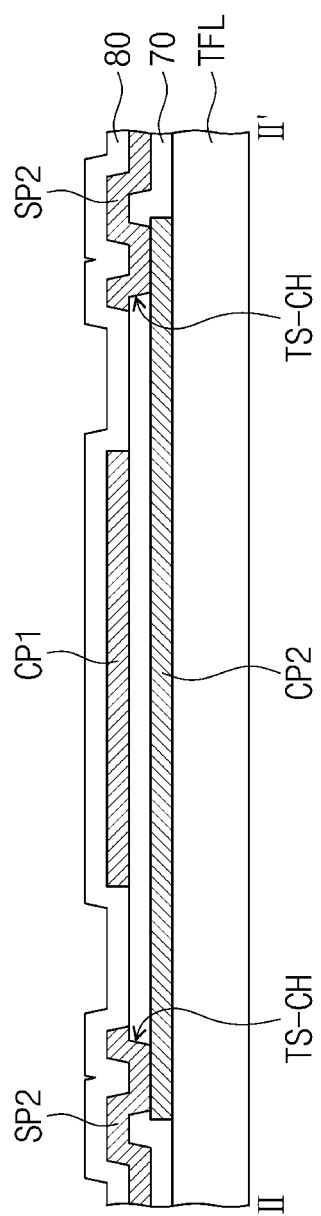
FIG. 11 is a cross-sectional view taken along a line II-II' shown in FIG. 10 according to an exemplary embodiment of the present inventive concepts.

FIG. 10 is an enlarged view showing a configuration of the first and second sensor portions SP1 and SP2 shown in FIG. 9, and FIG. 11 is a cross-sectional view taken along a line II-II' shown in FIG. 10.

FIG. 10 shows two first sensor portions SP1 adjacent to each other and two second sensor portions SP2 adjacent to each other as a representative example.

Referring to the exemplary embodiment of FIG. 10, the first and second sensor portions SP1 and SP2 may have the mesh shape. For example, each of the first and second sensor portions SP1 and SP2 may include a plurality of first branch portions BP1 extending in the first diagonal direction DDR1 and a plurality of second branch portions BP2 extending in the second diagonal direction DDR2.

The first branch portions BP1 of each of the first and second sensor portions SP1 and SP2 may intersect with and may be integrally formed with the second branch portions BP2. Openings TOP, each having a lozenge shape, may be defined by the first branch portions BP1 and the second branch portions BP2 crossing each other. The first and second branch portions BP1 and BP2 may be defined as mesh lines, and each mesh line may have a line width of a few micrometers.

The adjacent first sensor portions SP1 may be connected to each other by the first connection portion CP1. The first sensor portions SP1 may be integrally formed with the first connection portion CP1. In an exemplary embodiment, the first connection portion CP1 may have a mesh shape and may extend from the first sensor portions SP1.

The second sensor portions SP2 may be electrically connected to each other by the second connection portion CP2. In an exemplary embodiment, the second sensor portions SP2 may not be integrally formed with the second connection portion CP2. The second connection portion CP2 may be connected to the second sensor portions SP2 through a plurality of contact holes TS-CH.

Referring to the exemplary embodiment of FIG. 11, the second connection portion CP2 may be disposed on the thin film encapsulation layer TFL. For example, as shown in the exemplary embodiment of FIG. 11, a lower surface of the second connection portion CP2 may directly contact an upper surface of the thin film encapsulation layer TFL. A seventh insulating layer 70 may be disposed on the thin film encapsulation layer TFL to cover the second connection portion CP2. For example, as shown in the exemplary embodiment of FIG. 11, a lower portion of the seventh insulating layer 70 directly contacts an upper portion of the thin film encapsulation layer TFL and upper and side portions of the second connection portion CP2. The first connection portion CP1 and the second sensor portions SP2 may be disposed on the seventh insulating layer 70. The first sensor portions SP1 integrally connected with the first connection portion CP1 may also be disposed on the seventh insulating layer 70. An eighth insulating layer 80 may be disposed on the seventh insulating layer 70 to cover the first connection portion CP1 and the second sensor portions SP2. For example, as shown in the exemplary embodiment of FIG. 11, a lower surface of the eighth insulating layer 80 may directly contact upper and side surfaces of the first connection portion CP1 and the second sensor portions SP2.

The second connection portion CP2 may be connected to the second sensor portions SP2 through the contact holes TS-CH defined through the seventh insulating layer 70. Opposite lateral sides of the second connection portion CP2 may be connected to the second sensor portions SP2 through the contact holes TS-CH.

Figure 12:
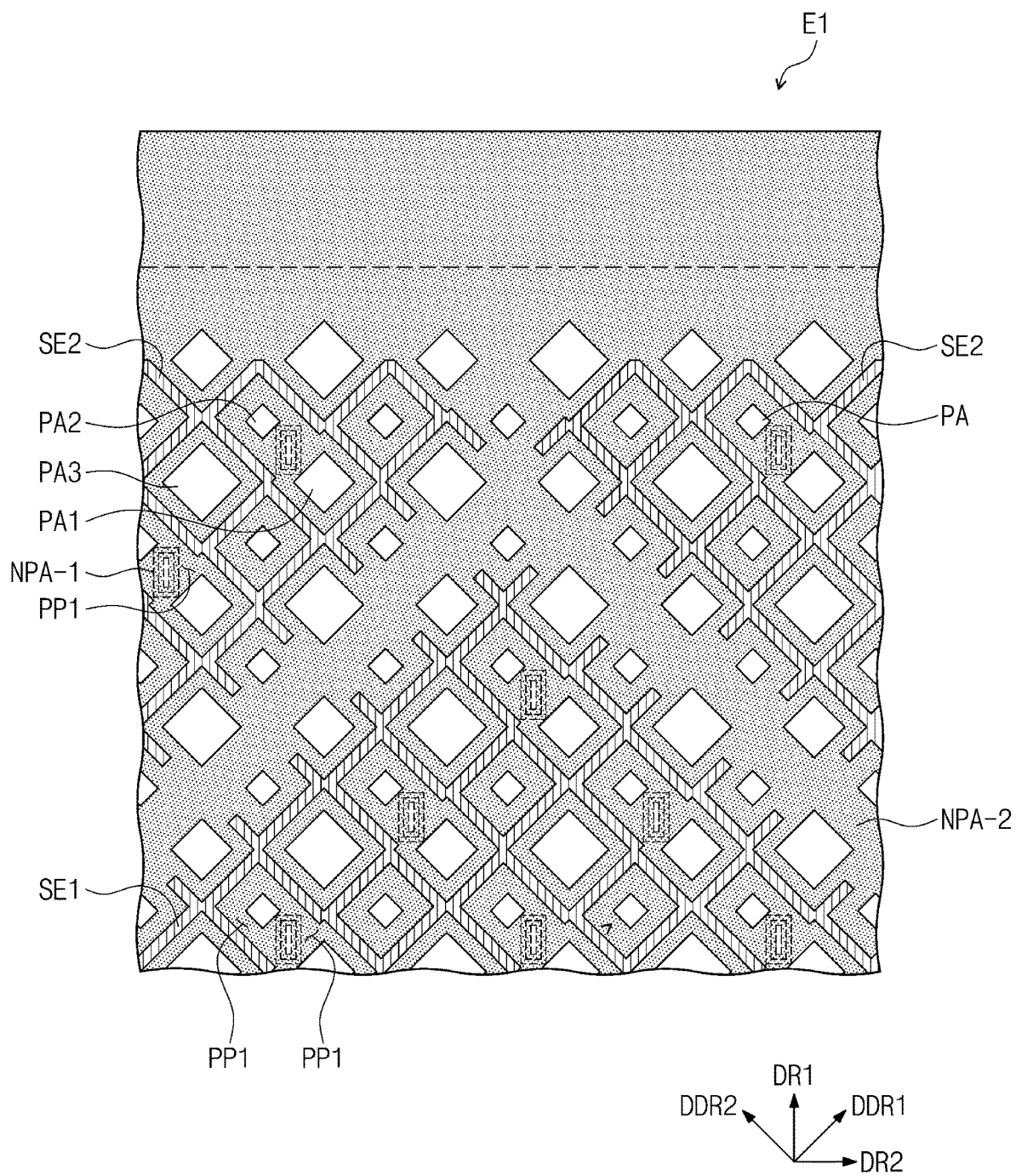
FIG. 12 is an enlarged view showing an area E1 shown in FIG. 9 according to an exemplary embodiment of the present inventive concepts.

FIG. 12 is an enlarged plan view showing an area E1 shown in FIG. 9 according to an exemplary embodiment of the present inventive concepts.

FIG. 12 is a view showing an arrangement of the sensing electrodes in the pixel areas shown in FIG. 5 according to an exemplary embodiment of the present inventive concepts.

Referring to the exemplary embodiment of FIG. 12, the input sensing unit ISP may include the first and second sensing electrodes SE1 and SE2 that overlap the non-pixel area NPA. For example, the first and second sensing electrodes SE1 and SE2 may be disposed between the first, second, and third pixel areas PA1, PA2, and PA3.

The first and second sensing electrodes SE1 and SE2 may overlap (e.g., in the third direction DR3) the second area NPA-2 of the non-pixel area NPA and may not overlap the first areas NPA-1 that overlap the first holes H1 and the second holes H2. For example, the first sensing electrodes SE1 and the second sensing electrodes SE2 may be disposed in an area of the input sensing unit ISP, which overlaps the second area NPA-2. The first sensing electrodes SE1 and the second sensing electrodes SE2 may not be disposed in an area of the input sensing unit ISP, which overlaps the first areas NPA-1. According to the present exemplary embodiment, since the first and second sensing electrodes SE1 and SE2 are not disposed in the area overlapping the first areas NPA-1, a first transmission area PP1 that overlaps (e.g., in the third direction DR3) the first area NPA-1 may be defined on the input sensing unit ISP.

Figure 13:
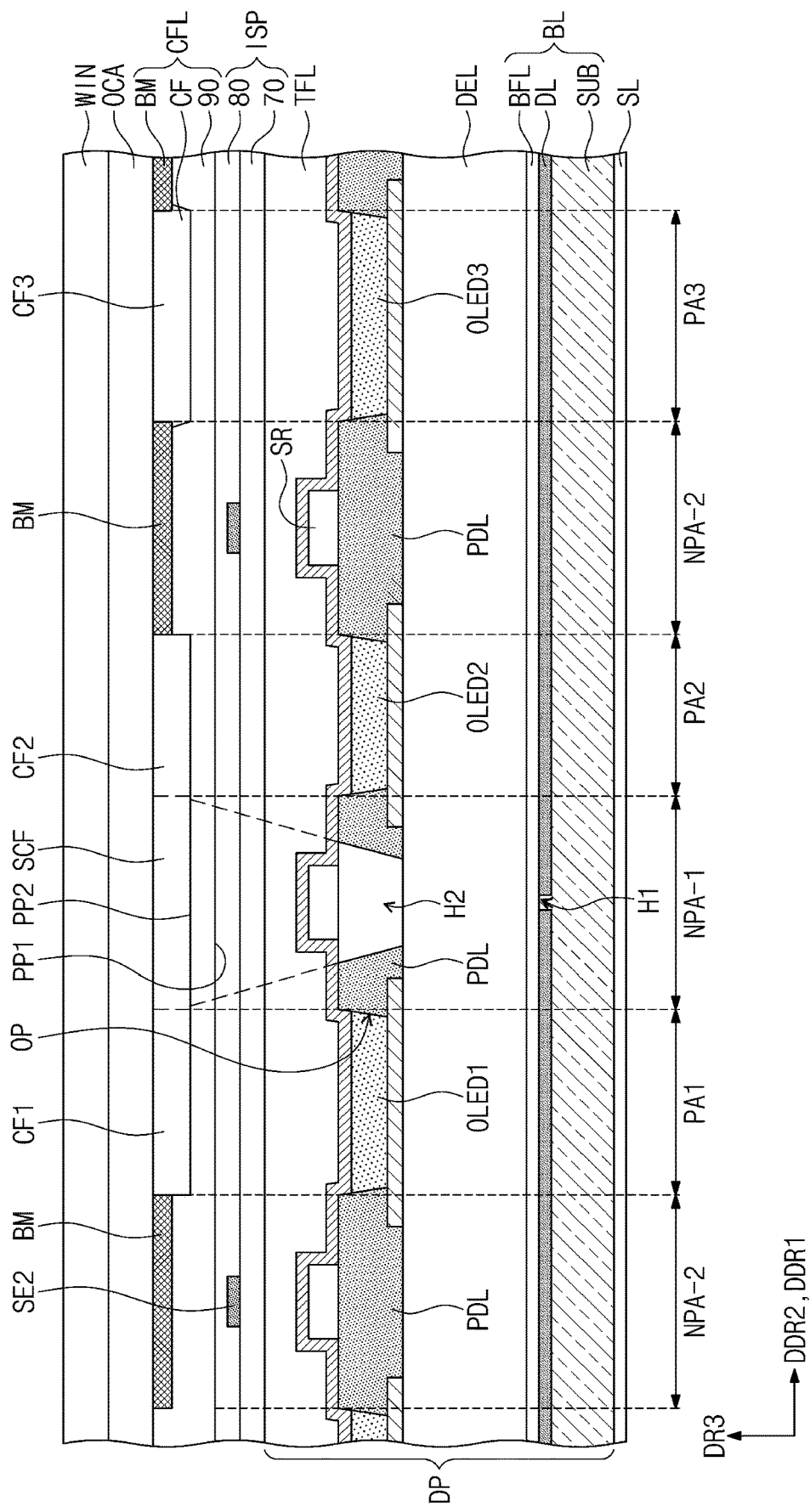
FIG. 13 is a cross-sectional view showing a display device according to an exemplary embodiment of the present inventive concepts.

FIG. 13 is a cross-sectional view showing a display device according to an exemplary embodiment of the present inventive concepts.

FIG. 13 shows a structure in which the input sensing unit ISP, the color filter layer CFL, and the window WIN are disposed on the display panel DP shown in the exemplary embodiment of FIG. 6. Hereinafter, any further repetitive descriptions of the same elements as those of FIG. 6 will be omitted.

Referring to the exemplary embodiments of FIGS. 10 and 13, the first and second sensing electrodes SE1, SE2 of the input sensing unit ISP may be disposed to overlap (e.g., in the third direction DR3) the second area NPA-2 of the non-pixel area NPA. The first and second sensing electrodes SE1, SE2 may not be disposed in an area overlapping the first area NPA-1 of the non-pixel area NPA. FIG. 13 shows the second sensing electrodes SE2 disposed on (e.g., disposed directly on) the seventh insulating layer 70, and the first sensing electrodes SE1 may not be disposed in the area overlapping the first area NPA-1 (refer to FIG. 10).

The color filter layer CFL may include first color filters CF1, second color filters CF2, and third color filters CF3. The first color filters CF1 may be disposed to overlap (e.g., in the third direction DR3) the first light emitting elements OLED1. The second color filters CF2 may be disposed to overlap (e.g., in the third direction DR3) the second light emitting elements OLED2. The third color filters CF3 may be disposed to overlap (e.g., in the third direction DR3) the third light emitting elements OLED3. For example, the first color filters CF1 may be red color filters which transmit red light, the second color filters CF2 may be green color filters which transmit green light, and the third color filters CF3 may be blue color filters which transmit blue light.

The color filter layer CFL may further include a black matrix BM and a ninth insulating layer 90. The black matrix BM may be disposed between the first color filters CF1, the second color filters CF2, and the third color filters CF3. The black matrix BM may be disposed to overlap the first and second sensing electrodes SE1, SE2. For example, the black matrix BM may be disposed to overlap the second area NPA-2 of the non-pixel area NPA. The black matrix BM may not be disposed in an area overlapping the first area NPA-1.

The black matrix BM may block the lights incident to the non-pixel area NPA. For example, the black matrix BM may have a black color. According to the present exemplary embodiment, since the black matrix BM that blocks the lights is not disposed in the area overlapping the first area NPA-1, a second transmission area PP2 that overlaps the first area NPA-1 may be defined on the color filter layer CFL.

Sub-color filters SCF may be disposed in the area overlapping (e.g., in the third direction DR3) the first area NPA-1. The sub-color filters SCF may extend from the second color filters CF2 disposed adjacent to the first area NPA-1 to the first pixel areas PX1. In an exemplary embodiment, the sub-color filter SCF may be the same color filter as the second color filter CF2. For example, the sub-color filter SCF may be a green color filter. When viewed in a plane, the sub-color filter SCF may have substantially the same area as the first area NPA-1. The first holes H1 and the second holes H2 may overlap (e.g., in the third direction DR3) the sub-color filter SCF when viewed in the plane (e.g., in a plane defined in the first direction DR1 and second direction DR2).

Figure 14:
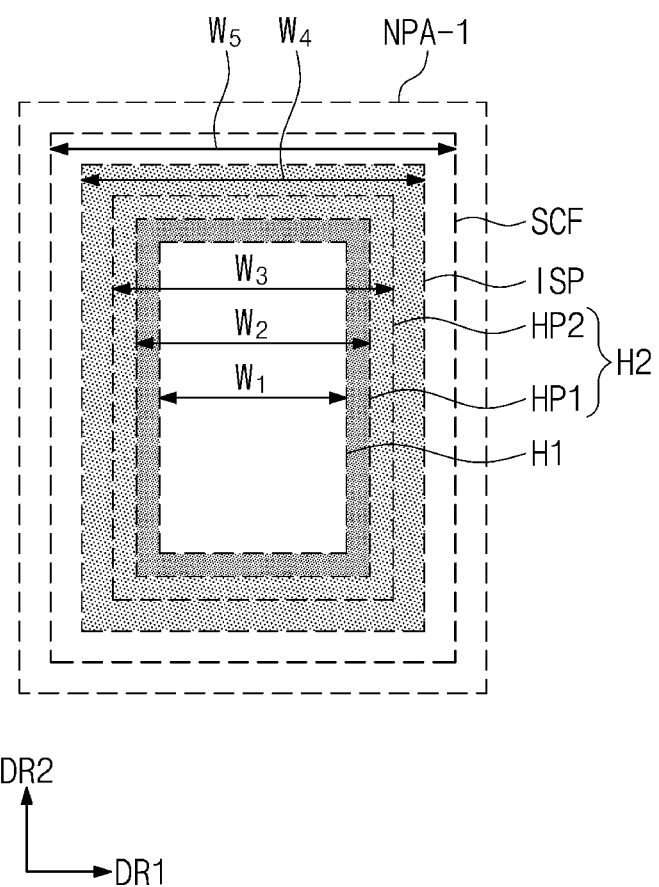
FIG. 14 is a plan view showing first areas shown in FIG. 13 according to an exemplary embodiment of the present inventive concepts.
Figure 15:
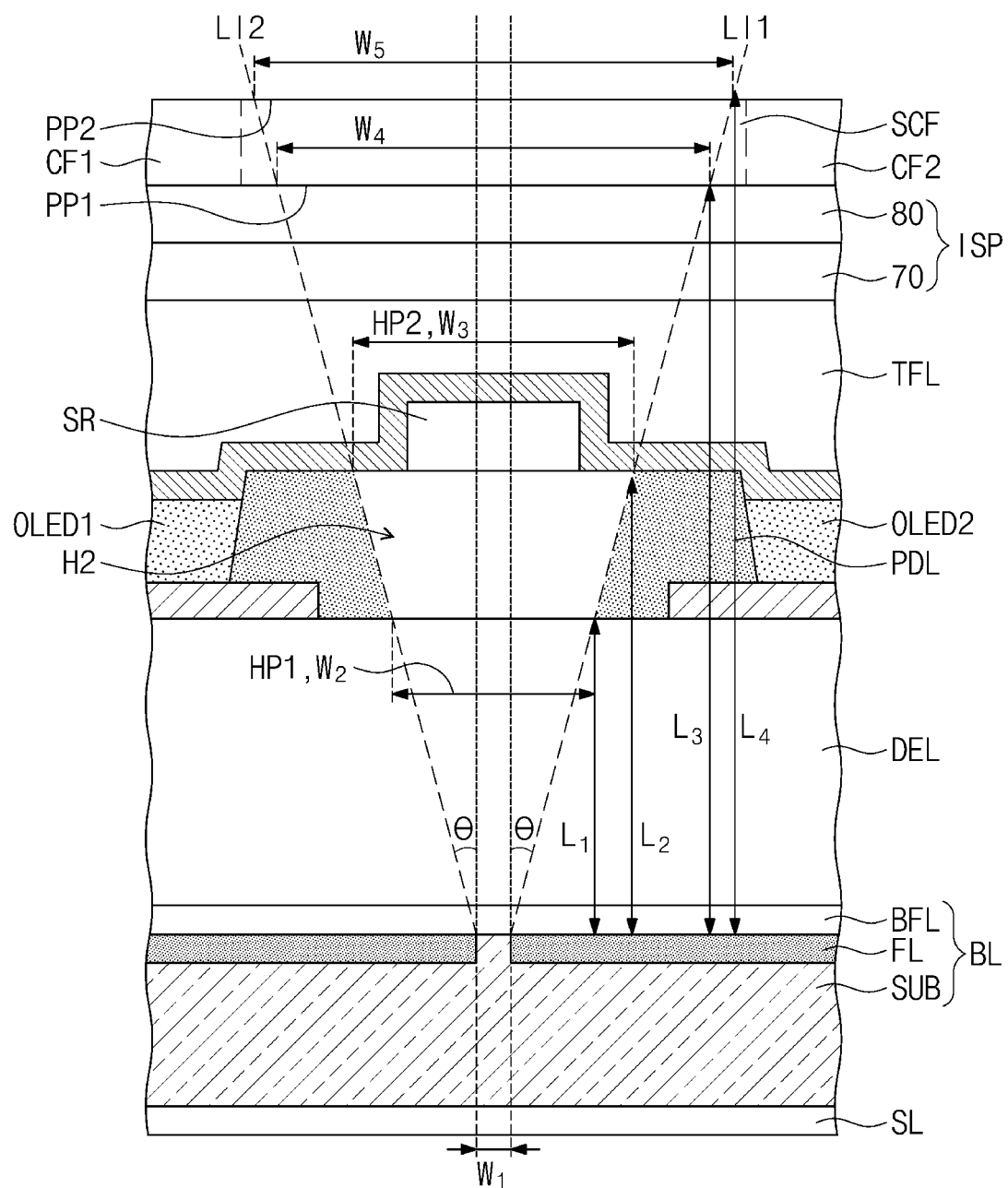
FIG. 15 is a cross-sectional view showing a first area shown in FIG. 13 according to an exemplary embodiment of the present inventive concepts.

FIG. 14 is a plan view showing the first area NPA-1 shown in FIG. 13 when viewed in the plane according to an exemplary embodiment of the present inventive concepts, and FIG. 15 is a cross-sectional view showing the first area NPA-1 shown in FIG. 13 according to an exemplary embodiment of the present inventive concepts.

Referring to the exemplary embodiments of FIGS. 14 and 15, the first area NPA-1 of the non-pixel area NPA may be defined as the light transmission area. The optical transmission path may be defined by the first and second holes H1 and H2 overlapping the first area NPA-1, the first transmission area PP1 defined in the input sensing unit ISP, and the second transmission area PP2 defined in the color filter layer CFL. When viewed in the plane, the first transmission area PP1 and the second transmission area PP2 may have a polygonal shape. For example, the first transmission area PP1 and the second transmission area PP2 may have a rectangular shape. However, exemplary embodiments of the present inventive concepts are not limited thereto.

The external lights may be incident to the first area NPA-1 and may reach the sensor layer SL after passing through the optical transmission path. When viewed in the plane, the sub-color filters SCF of the color filter layer CFL, at least a portion of the input sensing unit ISP, the second hole H2 of the pixel definition layer PDL, and the first hole H1 of the functional layer FL may be exposed through the first area NPA-1.

In an exemplary embodiment, the first hole H1 and the second hole H2 are areas in which substantially no material is present, whereas the insulating layer and the sub-color filter may be disposed in the first light transmission area PP1 and the second light transmission area PP2, respectively. However, the first light transmission area PP1 and the second light transmission area PP2 may transmit the lights incident to the first area NPA-1 downward (e.g., in a direction towards the substrate SUB).

A fourth width W4 of the first light transmission area PP1 and a fifth width W5 of the second light transmission area PP2 may satisfy the following Equations 3 and 4. In Equations 3 and 4, the fourth width W4 denotes a width in the first direction DR1 of the first light transmission area PP1, and the fifth width W5 denotes a width in the first direction DR1 of the second light transmission area PP2. For example, the fourth width W4 may denote a width of the first light transmission area PP1 on an upper surface of the input sensing unit ISP and the fifth width W5 may denote a width of the second light transmission area PP2 on an upper surface of the sub-color filter SCF of the color filter layer CFL.

$$W4 > W1 + 2 \times L3 \times \tan(\theta) \qquad \text{Equation 3}$$

$$W5 > W1 + 2 \times L4 \times \tan(\theta) \qquad \text{Equation 4}$$

In the above Equations 3 and 4, W1 denotes a width in the first direction DR1 of the first hole H1. W4 denotes the width in the first direction DR1 of the first light transmission area PP1, and the W5 denotes the width in the first direction DR1 of the second light transmission area PP2.

A third distance L3 may be a vertical distance (e.g., length in the third direction DR3) from the first hole H1 to an upper surface of the input sensing unit ISP. A fourth distance L4 may be a vertical distance (e.g., length in the third direction DR3) from the first hole H1 to an upper surface of the color filter layer CFL.

An incident angle θ may be a maximum angle formed by the lights incident to the first holes H1 and the vertical direction DR3. For example, a path LI1 of a first light and a path LI2 of a second light may form the incident angle θ with the vertical direction. The path LI1 of the first light and the path LI2 of the second light may form the maximum angle among the paths of the lights incident to the first hole H1. The lights incident to the first and second holes H1 and H2 may be incident along an optical transmission path defined between the first light path LI1 and the second light path LI2.

In an exemplary embodiment, widths in the second direction DR2 of the first light transmission area PP1 and the second light transmission area PP2 may satisfy the above Equations 3 and 4.

According to the exemplary embodiment of the present inventive concepts, in the display device DD including the color filter layer CFL and the pixel definition layer PDL having the black color, the optical transmission path is formed by the first hole H1 of the functional layer FL, the second hole H2 of the pixel definition layer PDL, the first transmission area PP1 of the input sensing unit ISP and the second transmission area PP2 of the color filter layer CFL, and thus, the external lights may easily reach the sensor layer SL. Accordingly, the sensor layer SL may be stably operated.

Figure 16:
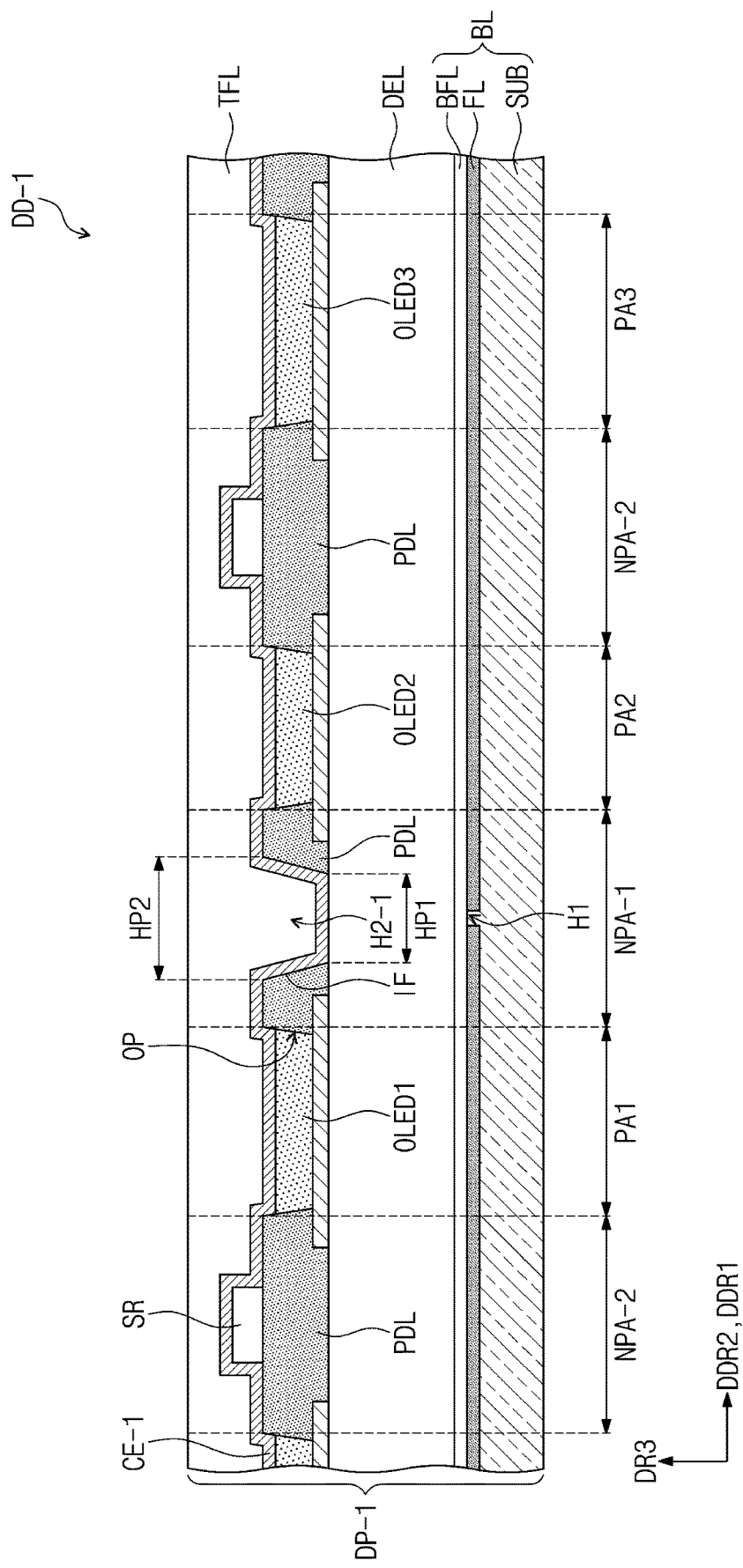
FIGS. 16 to 18 are cross-sectional views showing display devices according to exemplary embodiments of the present inventive concepts.
Figure 17:
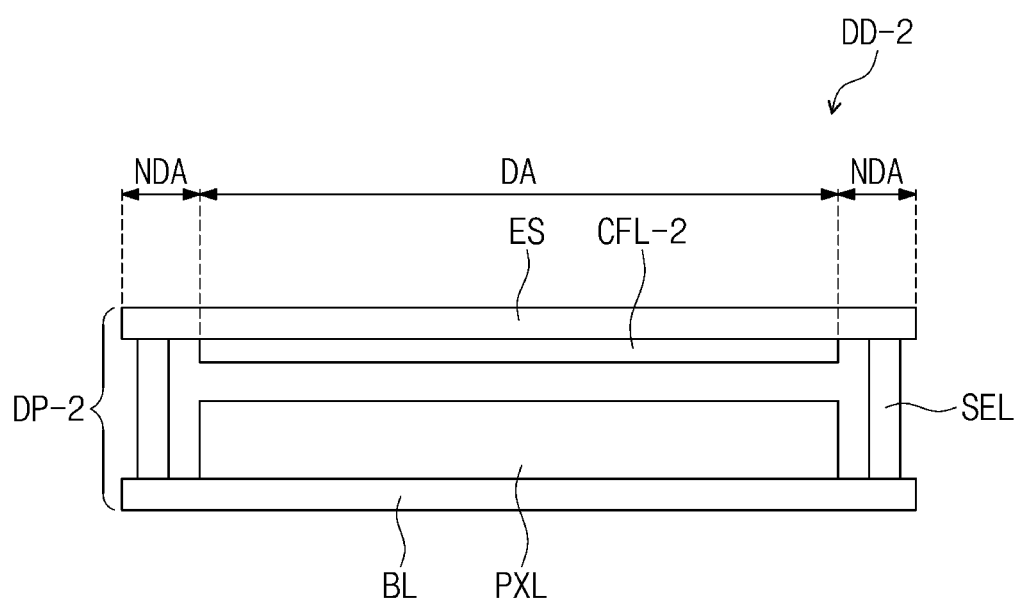
Figure 18:
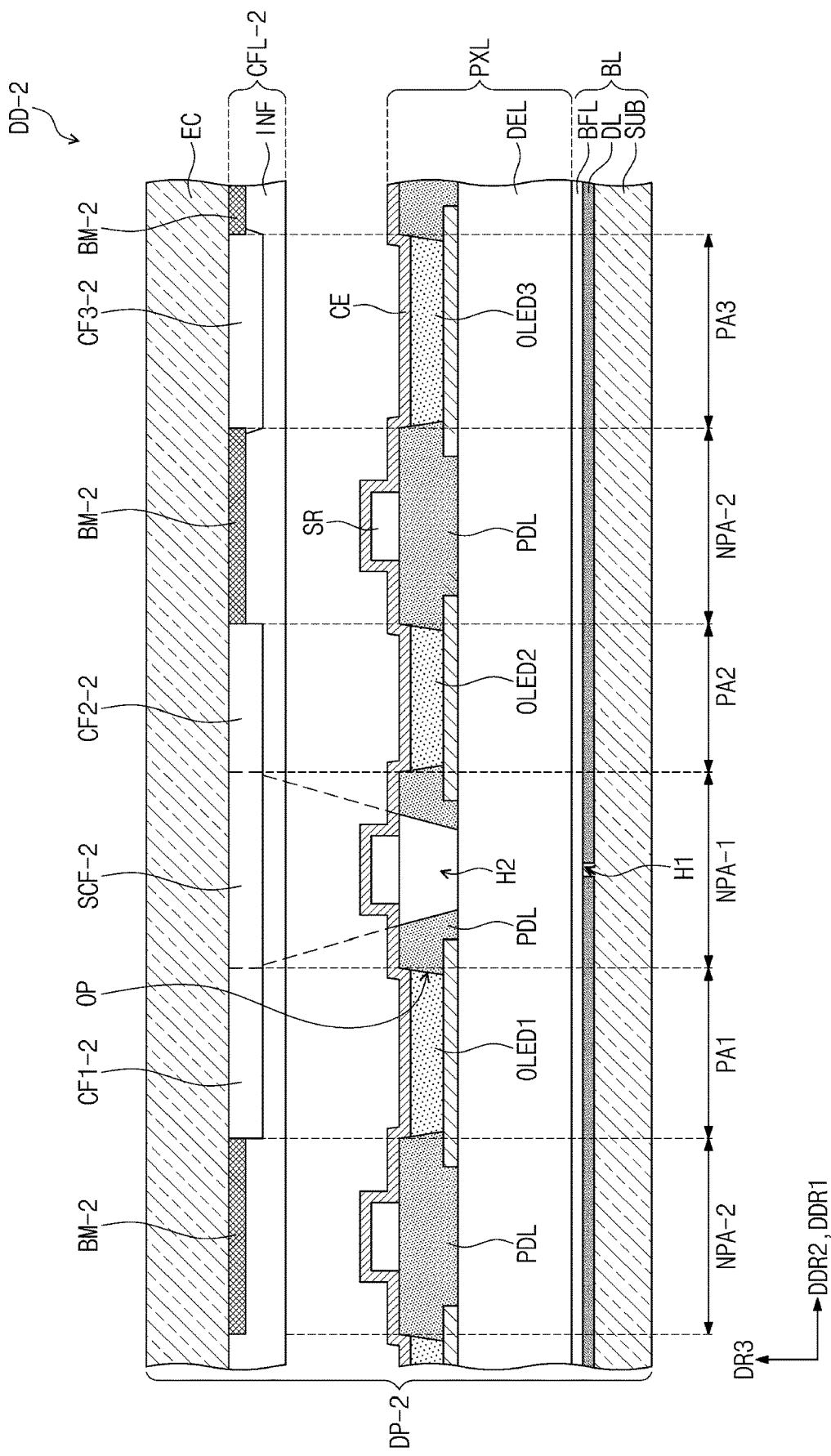

FIGS. 16 to 18 are cross-sectional views showing display devices according to exemplary embodiments of the present inventive concepts. Hereinafter, display devices DD-1 and DD-2 according to different exemplary embodiments from the above-described embodiments will be described with reference to FIGS. 16 to 18.

In the exemplary embodiments of FIGS. 16 to 18, the same reference numerals denote the same elements of the above-described embodiments, and thus, detailed descriptions of the same elements will be omitted. For the convenience of explanation, components, e.g., an input sensing unit, a window, etc., disposed on display panels devices DP-1 and DP-2 are omitted in FIGS. 16 to 18.

Referring to the exemplary embodiment of FIG. 16, the display device DD-1 may not include a spacer SR (refer to FIG. 6) in an area overlapping a first area NPA-1. As described above, the first area NPA-1 may be defined as an optical transmission area.

In the present exemplary embodiment, a second hole H2-1 may be filled with a second electrode CE-1 of light emitting elements OLED and a portion of a thin film encapsulation layer TFL. For example, a portion of the second electrode CE-1, which overlaps the second hole H2-1, may be disposed on an inclined surface IF of a pixel definition layer PDL and an upper portion of an element layer DEL. The upper portion of the element layer DEL may be the sixth insulating layer 60 (refer to FIG. 4).

The portion of the thin film encapsulation layer TFL may be disposed on the second electrode CE-1 disposed in the second hole H2-1. Therefore, the portion of the thin film encapsulation layer TFL, which overlaps the second hole H2-1, may protrude downward in the third direction DR3 towards the substrate SUB more than other portions of the thin film encapsulation layer TFL. For example, a portion of the thin film encapsulation layer TFL overlapping the second hole H2-1 may have a lowest height of the thin film encapsulation layer TFL.

The second electrode CE-1 and the thin film encapsulation layer TFL, which are disposed to overlap the second hole H2-1, may include a transparent material. Therefore, a portion of the lights incident to the display panel DP-1 may reach the sensor layer SL (refer to FIG. 2) through the second hole H2-1 and the first hole H1.

Referring to the exemplary embodiments of FIGS. 17 and 18, the display device DD-2 may include an encapsulation substrate ES. The encapsulation substrate ES may be disposed on a base layer BL. For example, the encapsulation substrate ES may be spaced apart from a pixel layer PXL disposed on the base layer BL in an upward direction (e.g., the third direction DR3). The encapsulation substrate ES may be a transparent substrate. For example, the encapsulation substrate ES may include a glass substrate.

As shown in the exemplary embodiment of FIG. 17, a color filter layer CFL-2 may be disposed between the encapsulation substrate ES and the pixel layer PXL (e.g., in the third direction DR3). The color filter layer CFL-2 may be disposed on a first surface of the color filter layer that faces the base layer BL among opposite surfaces of the encapsulation substrate ES.

As shown in the exemplary embodiment of FIG. 18, the color filter layer CFL-2 may include first, second, and third color filters CF1-2, CF2-2, and CF3-2, a black matrix BM-2, and an insulating film INF.

The first, second, and third color filters CF1-2, CF2-2, and CF3-2 may be disposed under the encapsulation substrate ES. Each of the first, second, and third color filters CF1-2, CF2-2, and CF3-2 may overlap a corresponding light emitting element among first, second, and third light emitting elements OLED1, OLED2, and OLED3.

The black matrix BM-2 may be disposed between the first, second, and third color filters CF1-2, CF2-2, and CF3-2. However, the black matrix BM-2 may not be disposed in an area overlapping the first area NPA-1.

Sub-color filters SCF-2 may be disposed in the area overlapping the first area NPA-1 of the color filter layer CFL-2. The sub-color filters SCF-2 may extend from the second color filters CF2-2. For example, when viewed in the plane, the sub-color filters SCF-2 may have the same area as the area of the first area NPA-1 and may overlap the first holes H1 and the second holes H2.

The insulating film INF may be disposed under the first, second, and third color filters CF1-2, CF2-2, and CF3-2 and the black matrix BM-2. The insulating film INF may compensate for a step difference between the first, second, and third color filters CF1-2, CF2-2, and CF3-2 and the black matrix BM-2 to allow one surface (e.g., a lower surface in the third direction DR3) of the color filter layer CFL-2 to be flat.

In the exemplary embodiment of FIG. 18, the color filter layer CFL-2 is disposed under the encapsulation substrate ES. However, exemplary embodiments of the present inventive concepts are not limited thereto and a position of the color filter layer CFL-2 may vary. The color filter layer CFL-2 may be disposed on the encapsulation substrate ES.

The display panel DP-2 of the display device DD-2 may include a sealing portion SEL. The sealing portion SEL may be disposed between the base layer BL and the encapsulation substrate ES. The sealing portion SEL may surround the pixel layer PXL. For example, the sealing portion SEL may be disposed to overlap the non-display area NDA.

The sealing portion SEL may form a gap between the base layer BL and the encapsulation substrate ES. The gap may be filled with an air or an inert gas. The sealing portion SEL may protect the pixel layer PXL disposed on the base layer BL.

Although the exemplary embodiments of the present inventive concepts have been described, it is understood that the present inventive concepts should not be limited to these exemplary embodiments but various changes and modifications can be made by one ordinary skilled in the art within the spirit and scope of the present disclosure. Therefore, the disclosed subject matter should not be limited to any single embodiment described herein.

What is claimed is:

1. A display device comprising:
   a display area comprising a plurality of pixel areas including a first pixel area and a second pixel area apart from the first pixel area and a non-pixel area surrounding each of the plurality of pixel areas, the non-pixel area including a first area, each of the first pixel area and the second pixel area adjacent to the first area;
   a plurality of light emitting elements respectively disposed on the pixel areas, and each of the light emitting elements comprising a first electrode, a second electrode, and an emitting layer between the first electrode and the second electrode;
   a color filter layer disposed on the light emitting elements and comprising a first color filter overlapping the first pixel area, a second color filter overlapping the second pixel area, and a sub color filter overlapping the first area; and
   a sensor layer overlapping the non-pixel area; and
   wherein each of the pixel areas overlaps the first electrode, the emitting layer, and the second electrode,
   wherein the sub color filter extended from the first color filter or the second color filter.

2. The display device of claim 1, further comprising a pixel definition layer including openings defined therethrough and respectively overlapping the pixel areas and the first area.

3. The display device of claim 2, further comprising a thin film encapsulation layer disposed between the plurality of light emitting elements and the color filter layer.

4. The display device of claim 3, further comprising an input sensing unit disposed between the thin film encapsulation layer and the color filter layer, wherein the input sensing unit comprises a plurality of sensing electrodes apart from the pixel areas and the first area in a plan view.

5. The display device of claim 2, wherein the pixel areas further comprises a third pixel area apart from the first and the second pixel areas, wherein the non-pixel area further comprises a second area adjacent to the second and the third pixel areas, and
   wherein the second area does not overlap the openings in a plan view.

6. The display device of claim 5, wherein the plurality of light emitting elements comprise:
   a first light emitting element overlapping the first pixel area and configured to generate a light having a red color;
   a second light emitting element overlapping the second pixel area and configured to generate a light having a green color; and
   a third light emitting element overlapping the third pixel area and configured to generate a light having a blue color.

7. The display device of claim 6, wherein the first area is disposed in a partial portion of an area between the first pixel area and the second pixel area.

8. The display device of claim 6, wherein the color filter layer comprising:
   a plurality of first color filter overlapping the first light emitting element, the first color filter is red color filter;
   a second color filter overlapping the second light emitting element, the second color filter is green color filter;
   a third color filters overlapping the third light emitting element, the third color filter is blue color filter; and
   a black matrix disposed between the first, second, and third color filters and
   wherein the black matrix apart from the first area and overlaps the second area in a plan view.

9. The display device of claim 5, further comprising a spacer disposed on the pixel definition layer, the spacer overlapping at least one of the first area and the second area.

10. The display device of claim 2, wherein at least one of the pixel definition layer and the functional layer has a black color.

11. The display device of claim 2, further comprising a functional layer overlapping the display area.

12. The display device of claim 11, further comprising:
    a substrate under the functional layer; and
    wherein the sensor layer disposed under the substrate, the sensor layer comprising at least one optical fingerprint sensor.

13. The display device of claim 11, wherein the sensor layer overlaps the pixel area.

14. The display device of claim 12, wherein the functional layer further comprising a first hole defined through the functional layer and overlapping the first area.

15. The display device of claim 14, wherein the openings comprising pixel openings overlapping the pixel areas and a second hole overlapping the first area, and
    wherein the first hole overlapping the second hole.

16. The display device of claim 15, wherein an area of the second hole is greater than an area of the first hole in a plan view.

17. The display device of claim 15, wherein the second hole comprises:
    a first portion positioned on a lower end of the second hole; and
    a second portion positioned on an upper end of the second hole,
    wherein the second portion has an area that is greater than an area of the first portion, the area of the first portion and the area of the second portion in a plan view.

18. The display device of claim 17, wherein the second hole has a width that gradually decreases from the second portion to the first portion.

19. The display device of claim 17, wherein a width of the first portion and a width of the second portion satisfy the following Equations 1 and 2:

$$W2 > W1 + 2 \times L1 \times \tan(\theta) \qquad \text{<Equation 1>}$$

$$W3 > W1 + 2 \times L2 \times \tan(\theta) \qquad \text{<Equation 2>}$$

wherein W1 is a width of the first hole, W2 is a width of the first portion, W3 is a width of the second portion, L1 is a vertical distance from the first hole to the first portion, L2 is a vertical distance from the first hole to the second portion, and θ is a maximum angle defined by lights incident to the first hole and the vertical direction.

20. The display device of claim 15, wherein each of the first hole and the second hole has a polygonal shape or a circular shape when viewed in a plan view.

* * * * *